United States Patent
Lur et al.

(10) Patent No.: US 7,138,329 B2
(45) Date of Patent: Nov. 21, 2006

(54) AIR GAP FOR TUNGSTEN/ALUMINUM PLUG APPLICATIONS

(75) Inventors: Water Lur, Taipei (TW); David Lee, Hsinchu (TW); Kuang-Chih Wang, Taichung (TW); Ming-Sheng Yang, Hsin-chu (TW)

(73) Assignee: United Microelectronics Corporation, Hsinchu (TW)

( * ) Notice: Subject to any disclaimer, the term of this patent is extended or adjusted under 35 U.S.C. 154(b) by 0 days.

(21) Appl. No.: 10/295,080

(22) Filed: Nov. 15, 2002

(65) Prior Publication Data

US 2004/0097065 A1    May 20, 2004

(51) Int. Cl.
*H01L 21/4763* (2006.01)
*H01L 21/76* (2006.01)
*H01L 21/331* (2006.01)
*H01L 21/8222* (2006.01)

(52) U.S. Cl. ............ 438/619; 438/421; 438/319; 438/411

(58) Field of Classification Search ............... 438/319, 438/411, 421, 422, 619, 618, 622, 631–632
See application file for complete search history.

(56) References Cited

U.S. PATENT DOCUMENTS

| | | |
|---|---|---|
| 4,789,648 A | 12/1988 | Chow et al. |
| 4,920,639 A | 5/1990 | Yee |
| 5,324,683 A | 6/1994 | Fitch et al. |
| 5,354,711 A | 10/1994 | Heitzmann et al. |
| 5,407,860 A | 4/1995 | Stoltz et al. |
| 5,466,639 A | 11/1995 | Ireland |
| 5,510,645 A | 4/1996 | Fitch et al. |
| 5,599,745 A | 2/1997 | Reinbert |
| 5,612,254 A | 3/1997 | Mu et al. |
| 5,614,765 A | 3/1997 | Avanzino et al. |
| 5,635,423 A | 6/1997 | Huang et al. |
| 5,702,982 A | 12/1997 | Lee et al. |
| 5,705,430 A | 1/1998 | Avanzino et al. |
| 5,708,303 A | 1/1998 | Jeng |
| 5,736,457 A | 4/1998 | Zhao |
| 5,744,376 A | 4/1998 | Chan et al. |
| 5,753,967 A | 5/1998 | Lin |
| 5,783,864 A | 7/1998 | Dawson et al. |
| 5,801,094 A | 9/1998 | Yew et al. |
| 5,821,169 A | 10/1998 | Nguyen et al. |
| 5,847,439 A | 12/1998 | Reinbert |
| 5,880,018 A | 3/1999 | Boeck et al. |
| 5,880,026 A | 3/1999 | Xing et al. |
| 5,949,143 A | 9/1999 | Bang |
| 5,989,997 A | 11/1999 | Lin et al. |

(Continued)

OTHER PUBLICATIONS

Ueda, Tetsuya et al., "A Novel Air Gap Integration Scheme for Multi-level Interconnects using Self-Aligned Via Plugs," 1998 Symposium on VLSI Technology Digest of Technical Papers, pp. 46-47.

(Continued)

*Primary Examiner*—Chuong Anh Luu
(74) *Attorney, Agent, or Firm*—J. Nicholas Gross

(57) ABSTRACT

An air gap structure and formation method for substantially reducing the undesired capacitance between adjacent interconnects, metal lines or other features in an integrated circuit device is disclosed. The air gap extends above, and may also additionally extend below, the interconnects desired to be isolated thus minimizing fringing fields between the lines. The integrated air gap structure and formation method can be utilized in conjunction with a tungsten plug process. Also, multiple levels of the integrated air gap structure can be fabricated to accommodate multiple metal levels while always ensuring that physical dielectric layer support is provided to the device structure underlying the interconnects.

34 Claims, 18 Drawing Sheets

U.S. PATENT DOCUMENTS

| | | | |
|---|---|---|---|
| 5,990,015 A | 11/1999 | Lin et al. | |
| 5,998,293 A | 12/1999 | Dawson et al. | |
| 6,001,414 A | 12/1999 | Huang et al. | |
| 6,004,883 A | 12/1999 | Yu et al. | |
| 6,017,817 A | 1/2000 | Chung et al. | |
| 6,025,259 A | 2/2000 | Yu et al. | |
| 6,027,994 A | 2/2000 | Huang et al. | |
| 6,037,249 A | 3/2000 | Chiang et al. | |
| 6,042,996 A | 3/2000 | Lin et al. | |
| 6,042,999 A | 3/2000 | Lin et al. | |
| 6,057,239 A | 5/2000 | Wang et al. | |
| 6,063,711 A | 5/2000 | Chao et al. | |
| 6,071,805 A | 6/2000 | Liu | |
| 6,077,767 A | 6/2000 | Hwang | |
| 6,077,769 A | 6/2000 | Huang et al. | |
| 6,083,821 A | 7/2000 | Reinberg | |
| 6,130,151 A | 10/2000 | Lin et al. | |
| 6,140,249 A * | 10/2000 | Sharan | 438/765 |
| 6,143,641 A | 11/2000 | Kitch | |
| 6,159,840 A * | 12/2000 | Wang | 438/618 |
| 6,159,845 A * | 12/2000 | Yew et al. | 438/637 |
| 6,162,723 A | 12/2000 | Tanaka | |
| 6,163,066 A | 12/2000 | Forbes et al. | |
| 6,177,329 B1 * | 1/2001 | Pang | 438/400 |
| 6,184,121 B1 * | 2/2001 | Buchwalter et al. | 438/622 |
| 6,200,891 B1 | 3/2001 | Jagannathan et al. | |
| 6,200,900 B1 | 3/2001 | Kitch | |
| 6,204,165 B1 | 3/2001 | Ghoshal | |
| 6,204,200 B1 | 3/2001 | Shieh et al. | |
| 6,208,015 B1 | 3/2001 | Bandyopadhyay | |
| 6,211,057 B1 | 4/2001 | Lin et al. | |
| 6,211,561 B1 | 4/2001 | Zhao | |
| 6,228,770 B1 | 5/2001 | Pradeep et al. | |
| 6,242,336 B1 | 6/2001 | Ueda et al. | |
| 6,252,290 B1 * | 6/2001 | Quek et al. | 257/522 |
| 6,291,030 B1 | 9/2001 | Chao et al. | |
| 6,297,125 B1 | 10/2001 | Nag et al. | |
| 6,380,106 B1 | 4/2002 | Lim et al. | |
| 6,440,876 B1 * | 8/2002 | Wang et al. | 438/778 |
| 6,642,138 B1 * | 11/2003 | Pan et al. | 438/619 |
| 6,727,159 B1 * | 4/2004 | Chen et al. | 438/435 |
| 2002/0028575 A1 | 3/2002 | Besling et al. | |
| 2002/0081787 A1 | 6/2002 | Kohl et al. | |
| 2002/0098677 A1 | 7/2002 | Ahn et al. | |
| 2002/0106888 A1 | 8/2002 | Vassalli et al. | |
| 2002/0127844 A1 | 9/2002 | Grill et al. | |
| 2002/0145201 A1 | 10/2002 | Armbrust et al. | |
| 2002/0158337 A1 | 10/2002 | Babich et al. | |
| 2002/0163082 A1 | 11/2002 | Lee et al. | |
| 2003/0109127 A1 * | 6/2003 | Tamaoka et al. | 438/619 |
| 2003/0176055 A1 * | 9/2003 | Wu | 438/618 |

OTHER PUBLICATIONS

Shieh, B.P. et al., "Integration and Reliability Issue for Low Capacitance Air-Gap Interconnect Structures," IEEE IITC, 3 pages, 1998.

* cited by examiner

FIRST EMBODIMENT

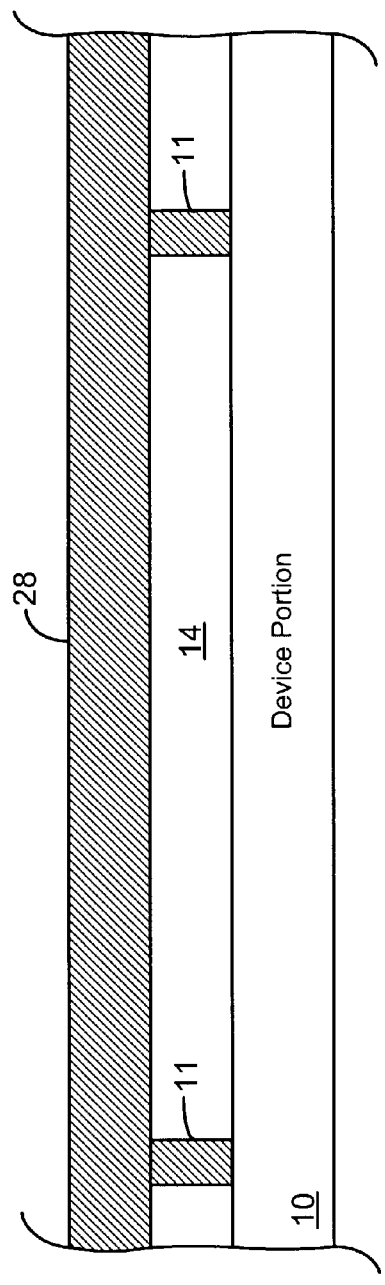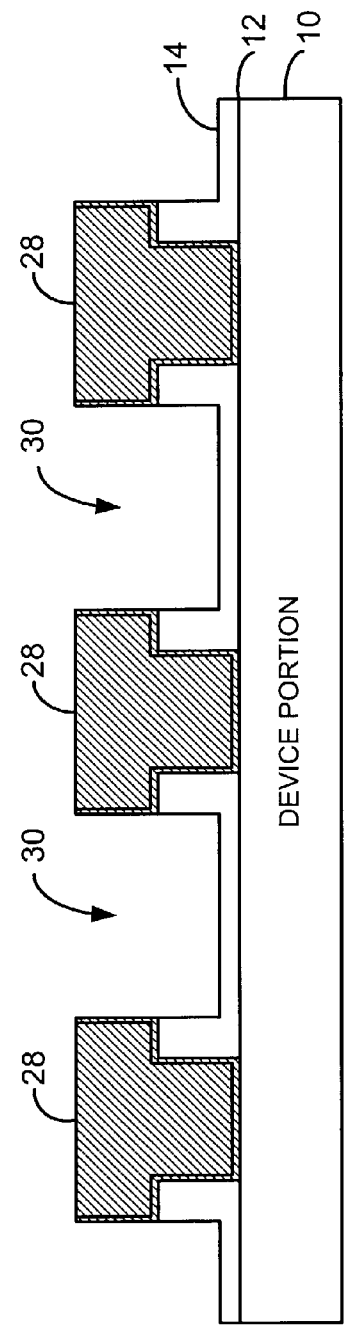

SECOND EMBODIMENT

THIRD EMBODIMENT

FOURTH EMBODIMENT

FIFTH EMBODIMENT

AIR GAP FOR TUNGSTEN/ALUMINUM PLUG APPLICATIONS

CROSS REFERENCE TO RELATED APPLICATIONS

The present application is related to the following applications all filed on this same date herewith:

Air Gap Structure And Formation Method For Reducing Undesired Capacitive Coupling Between Interconnects In An Integrated Circuit Device, application Ser. No. 10/295,062;

Air Gap For Dual Damascene Applications, application Ser. No. 10/295,719;

The aforementioned are hereby incorporated by reference as if fully set forth herein.

FIELD OF THE INVENTION

The present invention relates, in general, to the field of integrated circuit ("IC") device structures and methods of forming the same. More particularly, the present invention relates to an air gap structure and formation method for reducing undesired capacitive coupling in an integrated circuit device that uses tungsten plugs.

BACKGROUND OF THE INVENTION

As integrated circuit transistor densities increase, and feature sizes shrink, capacitive coupling between adjacent interconnects, metal lines or other elements also increases. The increased capacitive coupling results in increased parasitic capacitance, which undesirably slows circuit speeds and negatively impacts overall device performance.

Current attempts to improve electrical isolation in high density integrated circuits involve the implementation of low K dielectric materials such as hydrogen silsesquioxane (HSQ), SiLK™ (a trademark of The Dow Chemical Company) resin, Black Diamond™ (a trademark of Applied Materials company) low K film, Coral™ (a trademark of Novellus System Inc.) carbonaceous oxide film and several other exotic materials. While these materials have a relatively low dielectric constant, they are not normally used in semiconductor manufacturing and therefore increase manufacturing complexity and costs. Much work remains to effectively integrate these materials into conventional semiconductor manufacturing processes.

Some disadvantages of current low K materials include incompatible thermal coefficient of expansion, low mechanical strength and poor thermal diffusivity.

Another manner of improving electrical isolation between interconnects is to use an integrated air gap structure because of the extremely low dielectric constant of air. Previous attempts at air gap structures were hard to manufacture and also did not completely isolate adjacent metal lines due to fringing fields above and below the air gap itself.

For example, U.S. Pat. No. 6,177,329 to Pang (and particularly at col. 7, ll. 46+) illustrates one conventional approach in which an additional mask is used to pattern the underlying layers to form the air gaps. This is both inefficient and imprecise for extremely small geometries. U.S. Pat. No. 5,847,439 to Reinberg illustrates another approach in which a combination of a low melting point dielectric, photoresist, a heat cycle and surface tension interact to form a void between two adjacent metal lines. This technique is clearly not suitable for precise control of air gap sizes, and is further disadvantageous because it cannot be used to form gaps which extend above a metal line. The latter may be desirable in some applications. Finally, U.S. Pat. No. 5,949,143 to Bang depicts a rather complex process in which a small opening is made in an etch stop layer and then a selective isotropic etch is used to remove dielectric between two metal lines.

Clearly, while portions of the aforementioned references are useful in forming air gap structures, and could be used in many applications, their overall approach is not optimal from a manufacturing perspective.

What is desired, therefore, is an easily manufacturable integrated air gap structure that substantially electrically isolates adjacent interconnects, metal lines or other IC elements.

SUMMARY OF THE INVENTION

In accordance with the structure and method disclosed herein, a first method for forming a device having an air gap structure includes forming a device layer, which can include first level metal, capacitors, transistors, or other integrated circuit devices, as well as previously formed air gap structures fabricated according to the method of the present invention. A dual damascene structure with a plurality dual damascene opening is formed over the device layer, including first and second patterned dielectric layers. A copper or other conductive layer is formed to fill the dual damascene opening. An adjustable-depth trench is formed between the conductive pattern at least down to the surface of the device layer. The dual damascene structure itself is used as a hard mask in the etching of the trench. Finally, a third dielectric layer is formed onto the trench to form at least one air gap, the air gap optionally extending above the top surface of the dual damascene structure. If desired, the depth of the trench can be extended below the surface of the device layer.

A second method for forming an air gap structure in an integrated circuit according to the present invention includes forming an interconnect structure on the device layer including, for example, an patterned aluminum or aluminum alloy (conductive aluminum with or without minor amounts of another element or elements) conductive layer overlaying a tungsten conductive plug layer.

An adjustable-depth trench is formed between the patterned interconnect structure at least down to the surface of the device layer. A dielectric layer is formed over the trench to form an air gap therein, the air gap optionally extending above the top surface of the interconnect structure. If desired, the depth of the trench can be etched to extend below the surface of the device layer.

A third method for forming an air gap structure for an integrated circuit according to the present invention includes forming an interconnect structure on the device layer including an aluminum alloy interconnect layer overlaying an aluminum alloy plug layer. The conductive plug layer and interconnect layer can be formed simultaneously, thus eliminating at least two processing steps as compared to the second method of the present invention. An adjustable-depth trench is formed between the patterned interconnect structure at least down to the surface of the device layer. A dielectric layer is formed on the trench to form an air gap therein, the air gap optionally extending above the top surface of the interconnect structure. If desired, the depth of the trench can be etched to extend below the surface of the device layer.

It is an advantage of the present invention that the low dielectric constant of air is used to provide maximum electrical isolation by extending the air gap both below and above the adjacent isolated interconnects, or metal lines, while still ensuring that physical dielectric support is provided beneath the interconnects themselves.

It is a further advantage of the present invention that the air gap isolation structure is readily manufacturable and compatible with existing semiconductor manufacturing techniques.

It is a still further advantage of the present invention that exotic low K dielectric materials need not be used, thus saving costs and minimizing manufacturing complexity.

It is a still further advantage of the present invention that the existence of the air gaps is to release most of the system stress generated by subsequent thermal treatments.

It is a still further advantage of the present invention that the network structure using conventional dielectric layers encompassing the interconnects provides good thermal dissipation.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIGS. 1–12 are cross-sectional views of sequential integrated circuit processing steps for forming an air gap isolation structure according to a first embodiment of the present invention, using one of several acceptable dual-damascene metal interconnect processes;

DESCRIPTION OF PREFERRED EMBODIMENTS

First Embodiment

Referring generally now to FIGS. 1–13, a method for forming an integrated circuit device having an air gap structure is shown for a dual damascene-type metal interconnect structure.

Figure 1:
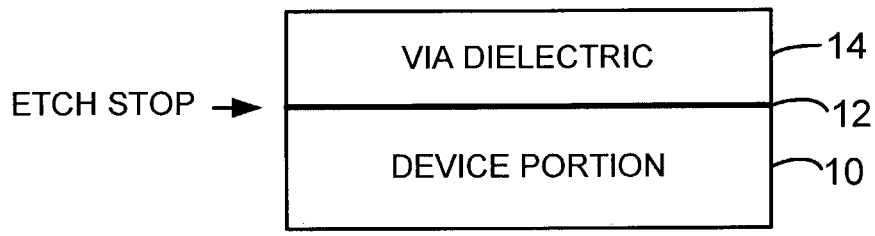

In FIG. 1, a device layer 10 is formed, which may be a simple silicon substrate and first-level metal, for example. The device layer 10 may nonetheless also include multiple levels of metal, transistors, capacitors, or other devices, including previously manufactured integrated air gap structures built according to the method of the present invention. Thus, device layer 10 is meant to represent that portion of the previously formed integrated circuit device on which the air gap structure is to be built, but it is not limited to any particular form, structure or circuitry.

Similarly, as used herein, the terms "on" or "onto" or "above" when used in connection with various thin film layers are merely intended to denote a physical spatial relationship, and not necessarily a direct physical or electrical contact. It will be understood therefore by those skilled in the art that in embodiments of the invention, a first layer may be "on" or "above" a second layer, even if there are other intervening layers present.

In a first embodiment, a first etch stop layer 12 is formed on the upper surface of the device layer 10. The etch stop layer 12 is ideally formed of silicon nitride (SiNx), silicon oxynitride (SiNxOy), silicon carbide (SiCx), or the like, and is deposited to a thickness of about 100 to 1500 Angstroms using any of a number of known conventional mechanisms. The particular material for any application of course can be determined by one skilled in the art by coordinating such selection with an etch chemistry/mechanism to be employed in a later etch operation. Thus, so long as such first etch stop layer is otherwise compatible with other materials and processes described herein, the present invention is not limited to any particular material.

A first dielectric layer 14 (designated generally herein as a "via" dielectric layer because the body of a via contact is later formed therein) is formed on etch stop layer 12. The first dielectric layer 14 is ideally silicon dioxide or undoped silicate glass (USG) but can also be fluorinated silicate glass (FSG), or borophosphorus silicate glass (BPSG), phosphorus silicate glass (PSG), or the like and is deposited to a thickness of about 1000 to 10000 Angstroms using well-known processing tools. Moreover, first dielectric layer 14 can include combinations and/or composites of individual thin film layers. Again, the particular formulation for this layer will depend on desired performance characteristics and process requirements, and thus a variety of materials are expected to be suitable for such layer.

Figure 2:
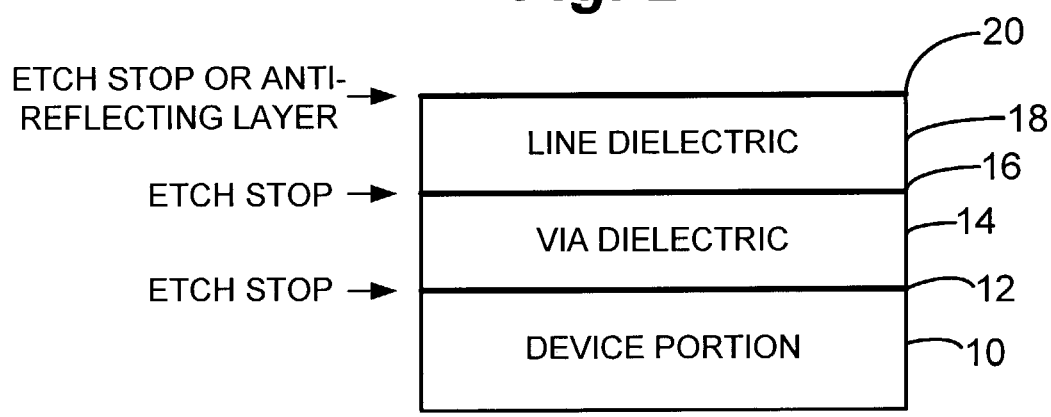

In FIG. 2, an additional second etch stop layer 16 is deposited onto the upper surface of via dielectric layer 14. As with etch stop layer 12, the particular composition of etch stop layer 16 is not critical, and can be determined without undue experimentation by one skilled in the art based on the present teachings and objectives defined herein for the inventions presented.

A second dielectric layer 18 (designated generally herein as a "line" dielectric layer because portions of a conductive line are later formed therein) is deposited onto the surface of etch stop layer 16. The line dielectric is also ideally silicon dioxide or a similar dielectric as via dielectric layer 14 and is deposited to a thickness of about 1000 to 10000 Angstroms. The selection of materials for this layer will again be a routine design choice based on lithographic and etching requirements associated with a particular manufacturing process.

A third etch stop and/or an anti-reflecting layer 20 is subsequently deposited on the line dielectric layer 18. Etch stop and/or anti-reflecting layer 20 is preferably SiNx, SiNxOy, silicon riched oxide (SRO), SiCx or the like and is deposited to a thickness of about 100 to 500 Angstroms. As with the other etch stop layers, the particular material for any application of course can be determined by one skilled in the art by coordinating such selection with an etch chemistry/mechanism to be employed in a later etch operation.

In general, the overall composition of the structure shown in FIG. 2 can be constructed with conventional and well-known manufacturing equipment suitable for wafer processing operations. The particular selection of materials for the thin film layers is directed primarily by concerns of reliability, reproducibility and lithographic constraints in small scale geometries, and so it is expected that a wide variety of combinations will be suitable for use in the present invention.

Figure 3:
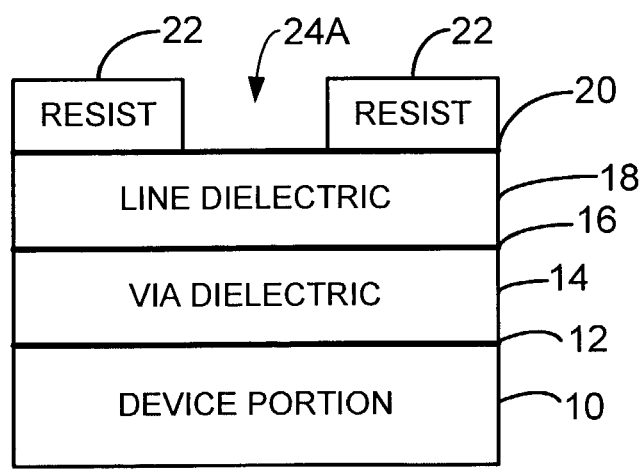

In FIG. 3, a photoresist layer 22 is formed on third etch stop and/or anti-reflecting layer 20 to a thickness of about 1000 to 10000 Angstroms. Photoresist layer 22 is patterned to form metal contacts or a via pattern 24A by any conventional photolithography process. The particular resist formulation and lithography process are again not material to the present teachings, so any suitable combination may be employed.

Figure 4:
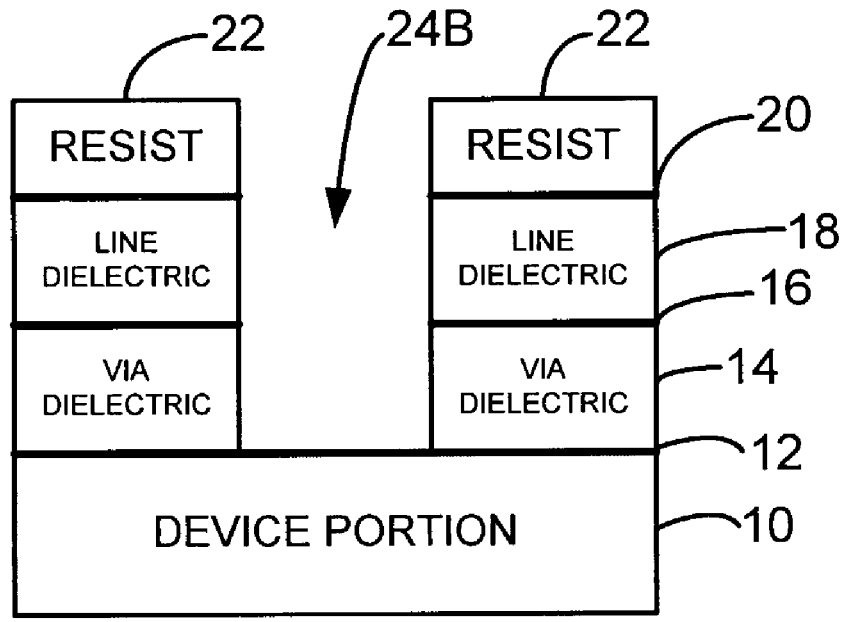

In FIG. 4, line dielectric layer 18 is anisotropically etched using via pattern 24A as a mask to form a metal contact or via opening 24B. A conventional oxide etch such as reactive ion etch (RIE) can be used for this step, which is terminated upon reaching first etch stop layer 12, or some other point before this. Other techniques will be apparent to those skilled in the art. It should be noted, of course, that etch stop layer 12 can also be removed in those areas (not shown) where it may be desirable to make a conductive contact to some portion of device layer portion 10.

Figure 5:
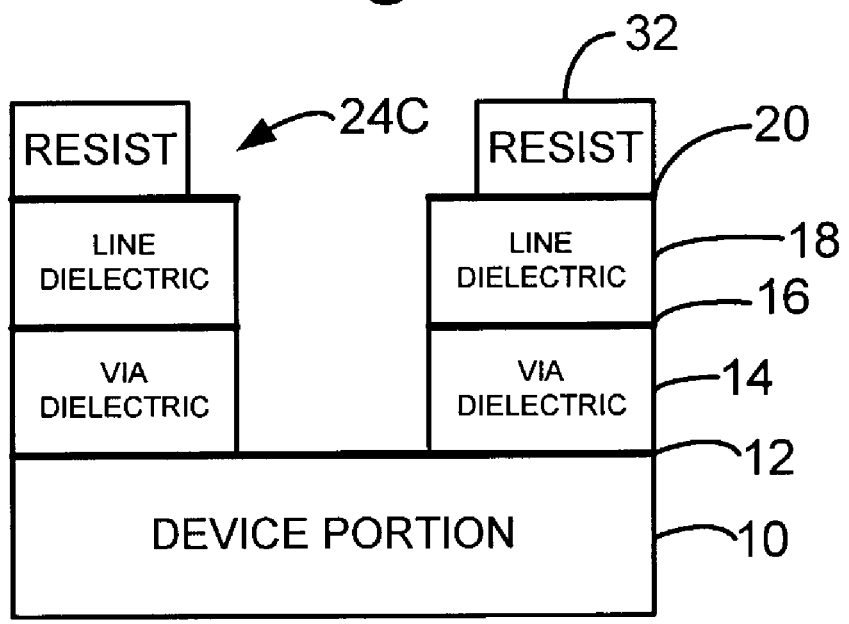

In FIG. 5, after removing the resist layer 22, another photoresist layer 32 is processed to form a metal line pattern 24C by photolithography processes. Again, the particular resist formulation and lithography process for layer 32 are again not material to the present teachings, so any suitable combination may be employed.

Figure 6:
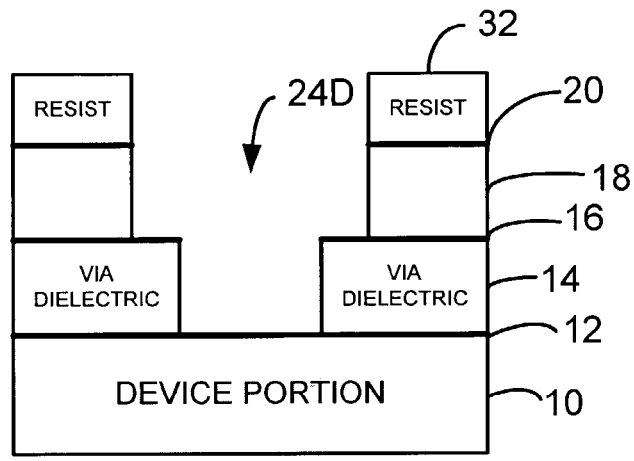

In FIG. 6, both line dielectric layer 18 and via dielectric layer 14 are etched to form an opening 24D for subsequent processing of the dual damascene structure. This etching operation is also done with a conventional etch such as reactive ion etch (RIE) can be used for this step, which is preferably terminated upon reaching second etch stop layer 16. Other techniques will be apparent to those skilled in the art. Thus, both photoresist layer 32 and the patterned etch stop layer 16 act as a form of mask for this operation.

It should be noted that the upper portion of opening 24D serves as an interconnect line while the bottom portion of opening 24D functions as a conductive pillar to the device portion. The result is a conductive line 28 with a cross section in some areas that resembles a T-shape as seen in the Figures.

Figure 7:
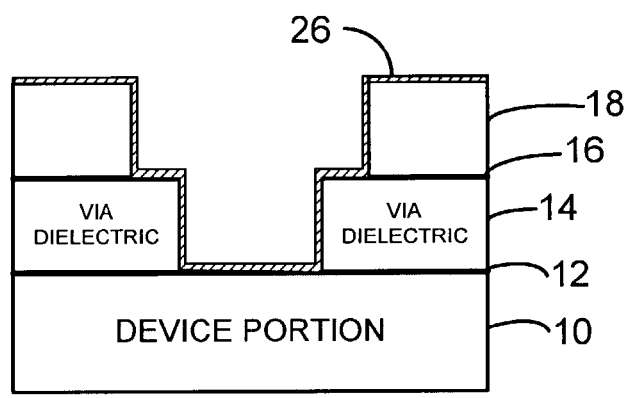

In FIG. 7, resist layer 32 is stripped using a conventional process and a composite copper barrier/seed layer (shown as a single integrated layer 26 for simplicity) is deposited using conventional means. The first portion of copper barrier/seed layer is a barrier layer selected from a group of conductive materials that can prevent Cu from diffusing into adjacent dielectric layers, such as Ta, TaN, TiN, TiW, WN, Mo, W, etc. These are examples known to the inventors at this time, and it is possible of course that later developed materials unforeseen and as yet undiscovered may prove to be suitable for this purpose.

A seed layer portion of composite barrier/seed layer 26 is typically Cu or Cu alloy, again deposited using known means.

In a preferred embodiment, the copper barrier layer portion is deposited to a thickness of about 50 to 500 Angstroms, and the seed layer portion is deposited to a thickness of about 300 to 2000 Angstroms to form combined layer 26. It will be understood by those skilled in the art that these values are merely exemplary for the geometries described therein, and that the final values for any particular embodiment of the invention may deviate from such figures.

Figure 8:
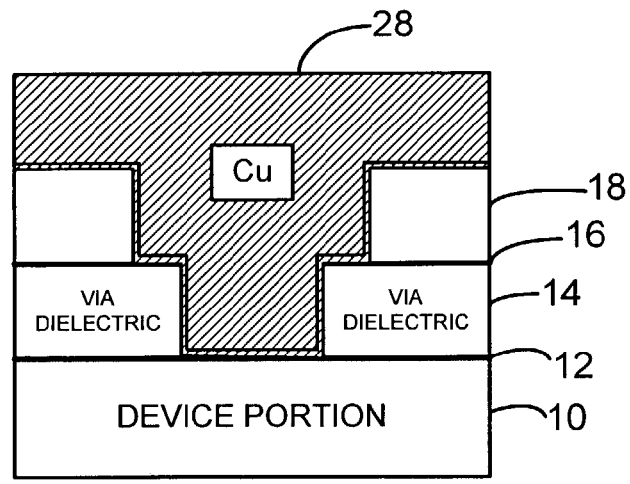

In FIG. 8, opening 24D is then filled with a copper layer 28. Copper is deposited to a thickness of about 2000 to 10000 Angstroms using any well-known conventional tools, which preferably completely fills opening 24D and provides an excess copper layer. It will be understood, of course, that the deposition of this layer may be achieved in a single step, or multiple steps to provide a graded and/or composite copper layer within opening 24D.

Figure 9:
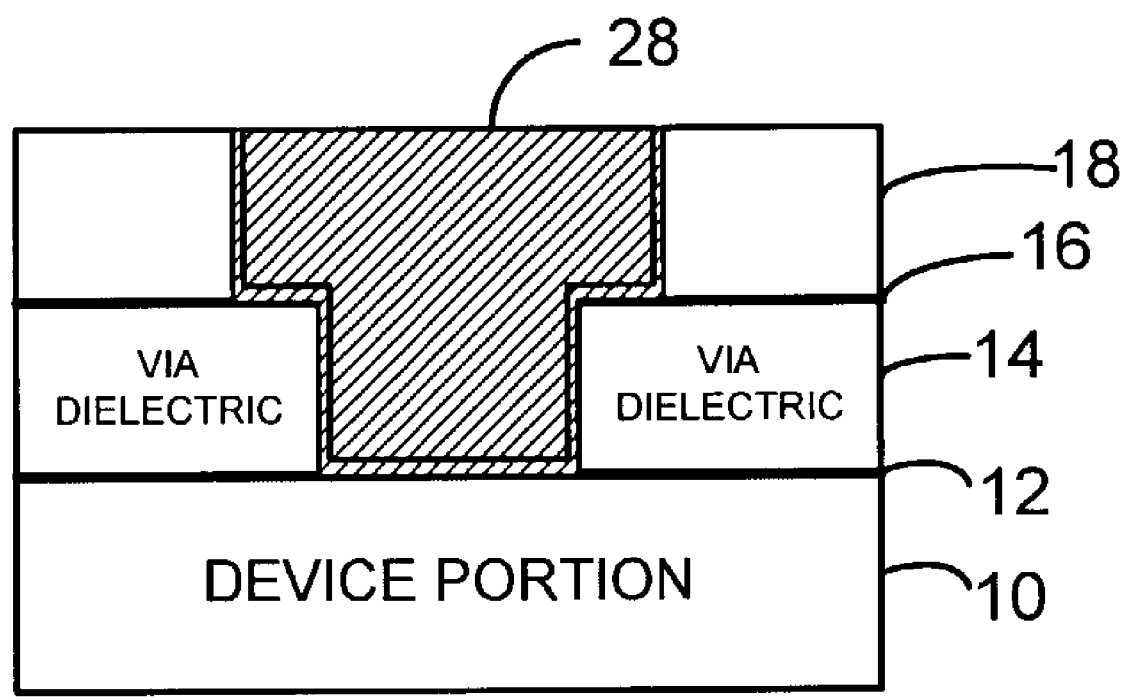

In FIG. 9, any excess copper on top of line dielectric 18 is removed preferably using chemical-mechanical polishing (CMP) with a suitable polish pad, slurry, recipe, etc. as is known to those skilled in the art. In self-limiting growth processes, this type of CMP operation may be minimized or reduced. The above steps for defining the openings and forming the Cu lines within such openings 24D are merely an example of the preferred technique known to the inventors at this time, and it is possible of course that later developed processes unforeseen and as yet undiscovered may prove to be suitable for such purposes.

Figure 10:
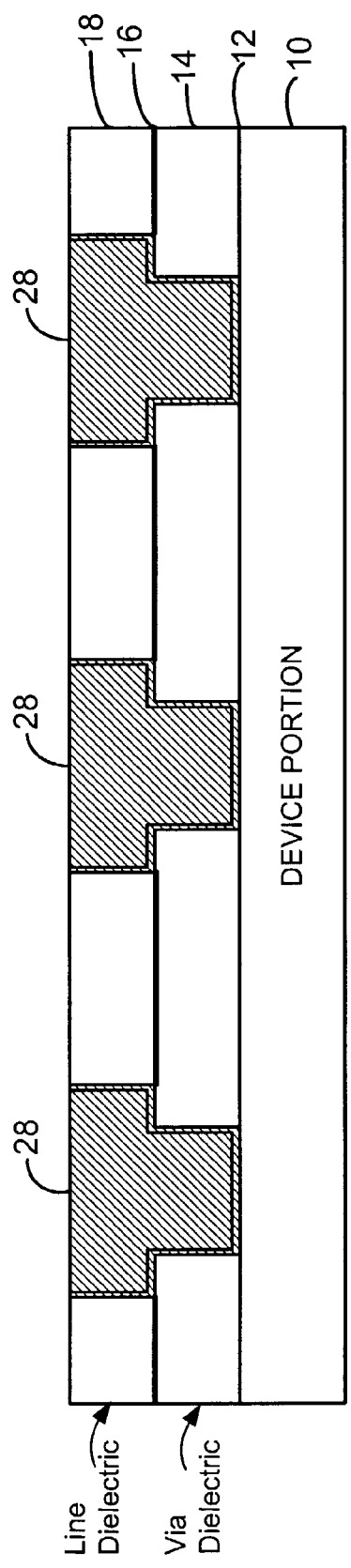

In FIG. 10, a plurality of dual damascene metal conductive lines 28 form an interconnect structure 28'. Each dual damascene metal interconnect line 28 is isolated primarily at this point by a combination of dielectric layers 14 and 18.

Figure 10A:
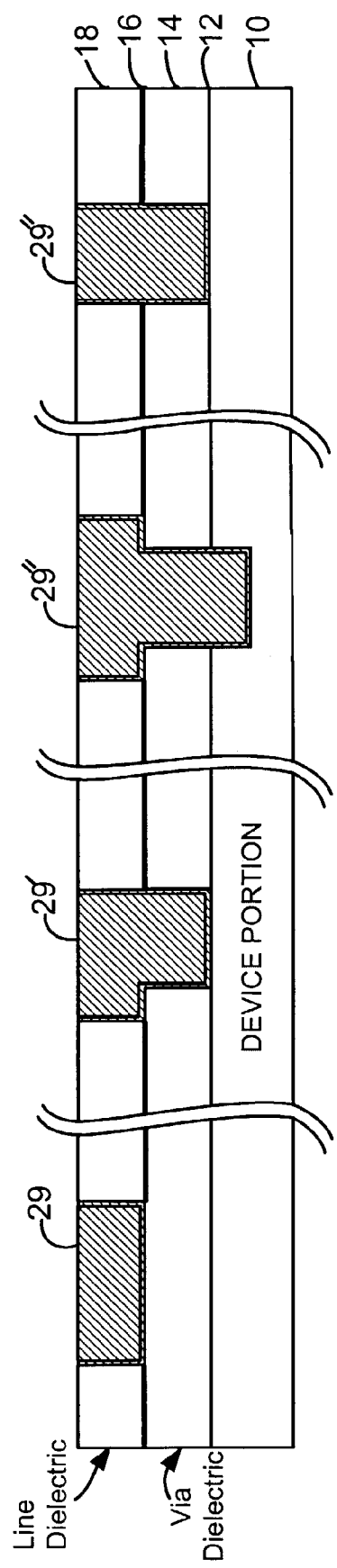

Other cross-sectional portions of a wafer are illustrated in FIG. 10A to show some additional examples of structures/relationships that may exist. For example, in some areas an conductive line 29 may not extend down to device layer 10 (the most likely case for a metal line); in other areas 29' the position of the via is not symmetric about the metal line. In other areas 29" the via part of the dual damascene structure may extend to the device portion 10 and may be contacted to the substrate. In other area 29''', the metal line part of the dual damascene structure is about the same width as that of via parts. Thus, a variety of cross-sectional patterns will result. It will be understood by those skilled in the art that these are merely exemplary, and that other portions of a wafer are likely to contain additional variants of those illustrated depending on interconnect/masking requirements.

As alluded to earlier, at least some of the conductive lines 28 may be included as part of a so-called "dummy" pattern so as to make the interconnection patterns more uniform across the surface of a wafer. This also facilitates the manufacturing process because the resulting surface is more uniform.

In FIG. 10B, a side perspective can be seen of another exemplary conductive line 28 viewed lengthwise as it may be formed for an integrated circuit. At individual points across the surface, a lower portion of conductive line 28 extends (in some instances) as a type of conductive pillar 11 to form an electrical contact at selective points to device layer 10. These conductive pillars are formed from a combination of material from conductive line 28 that is surrounded by dielectric material 14 for additional support.

In FIG. 11, dielectric layers 14 and 18 from FIG. 10 are preferably anisotropically etched using copper layer 28 as a hard mask. A conventional dielectric etch is used to form trenches 30 into dielectric layers 14 and 18. The form and depth of trenches 30 is adjustable and can extend down to the upper surface of the device layer 10, or can be etched further to extend down below etch stop layer 12 and below the surface of device layer 10 (not shown in FIG. 11).

For reasons that are explained in more detail below, an anisotropic etch (or an etch type with reduced isotropic behavior) is preferred over a "wet" isotropic etch at this point, because it is desirable to leave some small amount of dielectric on the sidewalls of interconnect 18, underneath the overhang areas as seen in FIG. 11. Of course, in some cases it may be desirable to remove such remaining material (from layer 14) and replace it with another material (i.e., through another spin on deposition/plasma deposition and subsequent etch. An isotropic etch could then be used on layer 14. While this would require additional processing steps, it is conceivable that the dielectric constant could be improved in this fashion, as well as reliability, yield etc. of the overall process.

The depth of trenches 30 is preferably controlled through a timed etch, and it will be apparent to those skilled in the art that the duration of such etch will be a function of the dielectric layer composition, the etch process chemistry, the thickness of layers 14, 18, etc., etc. The etch time will thus vary from application to application, and can be determined with routine simulations and testings.

Alternatively it is possible instead to use either etch stop layer 12 to control the end of the etch, and/or to provide yet another etch stop layer (not shown) within layer 14 at any optimally determined etch depth. In such instance, of course, layer 14 would be a composite layer deposited in separate steps, and thus this option is not as attractive from a throughput perspective.

As noted above, a preferred approach uses copper conductive lines 28 as a mask, but it those skilled in the art will appreciate that an additional masking step could be employed should it be necessary to make the air gaps more narrow. Again, this is not optimal from a control and throughput perspective, so it is probably not desirable except in limited cases.

In contrast, in the present invention, it should be relatively simple and easy to control the size of such air gaps both by controlling the spacing between the conductive lines 28, as well as tailoring the size/shape of the top portion of the conductive line. This is true since the latter effectuate the hard mask used for etching dielectric layers 14, 18 to form the air gaps.

In this respect, those skilled in the art will appreciate that shapes and sizes of the interconnect structures shown in the figures are only approximate, and not intended to be to scale. Other variations are expected to be beneficially employed in accordance with the present teachings.

In FIG. 12, a copper barrier layer 44 such as SiNx, SiC, or the like is deposited to a thickness of about 50 to 500 Angstroms. Again, these are materials particularly suited for copper, and other compositions may be needed for other types of conductive line metals. For some metals, of course, a barrier layer may not be needed in the first place.

A silicon-dioxide dielectric layer, or the like 32 is then deposited to a thickness of about 2000 to 10000 Angstroms. Poor step coverage by the deposition of dielectric layer 32, such as conventional plasma enhanced chemical vapor deposition (PECVD), results in the formation of intra-metal line air gaps 34. In other words, the present invention exploits the basically conformal growth nature of this type of process to intentionally form gaps between the metal lines. By controlling the deposition parameters, and the thickness of the deposited layer, the size, shape and height of air gaps 34 can be customized for any particular line interconnect geometry.

In lieu of a PECVD process, other similar techniques that are characterized by poor step coverage could be used to form air gaps 34. For example, a series of HDPCVD depositions could be used. As those skilled in the art will appreciate, the above are merely examples of techniques for achieving poor step coverage that are known to the inventors at this time, and it is possible of course that later developed processes unforeseen and as yet undiscovered may prove to be suitable for such purposes.

As previously discussed, the inclusion of air gaps 34 provides superior electric isolation due to the low dielectric constant of air. The size and shape of air gaps 34 may also vary across the surface of a wafer, as illustrated generally in FIG. 12A. It can be seen in such picture that the width of any air gaps (W1 or W2) are not necessarily uniform across the surface of the wafer, nor are they required to be for purposes of the present invention. It is simply desirable, of course, to ensure that at least some air filled gap is provided between two adjacent signal lines.

Figure 12A:
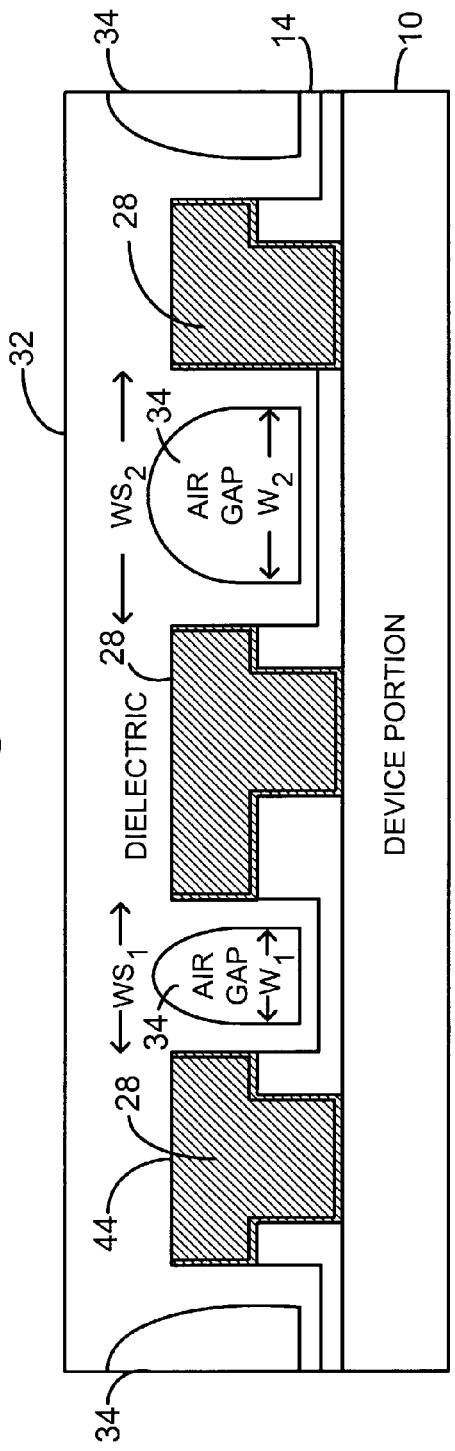

Thus, as seen in FIG. 12A, one useful benchmark is to consider the relative ratio of the airgap width (W1, W2) to an overall line spacing (WS1, WS2). In general, the closer W1/WS1 and W2/WS2 are to unity, the lower the capacitance, so it is preferable to maximize this value to the extent consistent with other processing requirements.

Figure 12B:
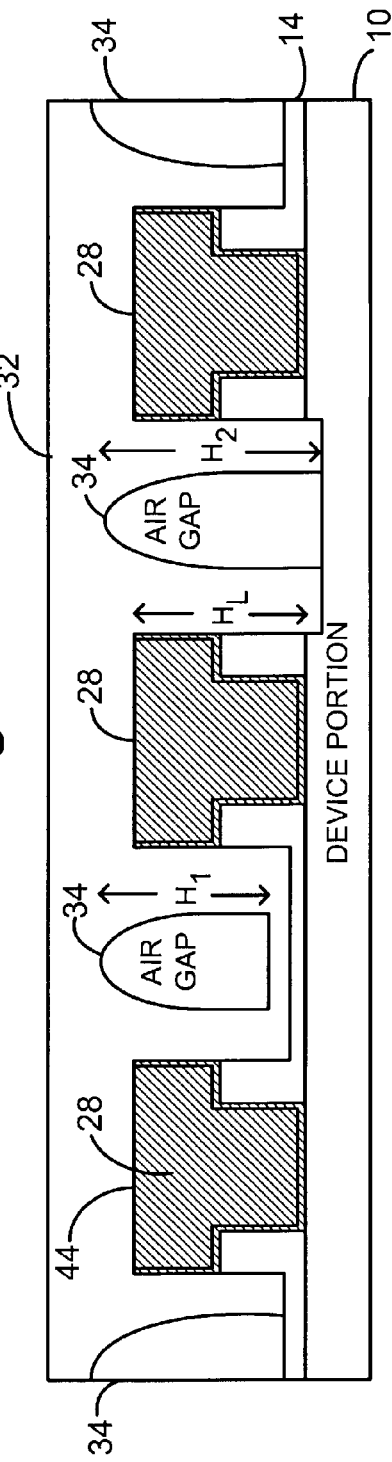

In addition, the height by which the air gaps 34 extend above interconnect layer 28, or below such layer, is controlled both by the trench sizing noted earlier, as well as the details of the conformal dielectric deposition noted earlier. Thus, they may also vary in vertical size as seen in FIG. 12B, where two different heights (H1 and H2) are provided. Again it is understood that the height of any air gaps (H1 or H2) are not necessarily uniform across the surface of the wafer, nor are they required to be for purposes of the present invention. Nonetheless, for reasons well understood in the art, it is preferable (to the exent possible within available process constraints) to maximize such air gap heights (in relation to the height HL of the conductive lines 28) by extending them above and below an interconnect structure 28 to reduce the capacitance between adjacent lines.

In summary, an inter-line interconnect structure as shown in FIG. 12 typically includes a metal line 28, an conductive line sidewall dielectric portion 14', a second dielectric filler 32, and air gap 34. The sidewall dielectric portion 14' left underneath metal line 28 provides structural support and additional process window margin when the present invention is used in small scale line width geometries.

Those skilled in the art will further appreciate that the above are merely examples of what might be present in any section of the wafer, and that other air gap structures will inevitably result as part of any conventional manufacturing process employing the present teachings.

As further noted, to reduce non-uniformities for such air gaps, dummy metal lines can be added to an interconnect pattern to ensure that no large flat spaces are left between adjacent conductive lines. Thus, for example, in FIG. 12, for some instances across the surface of the wafer, the middle metal line 28 may be carrying an actual signal, and in other instances, a "dummy" metal line 28 may be simply added so as to create a uniform capacitance everywhere for the metal lines adjacent thereto.

Figure 13:
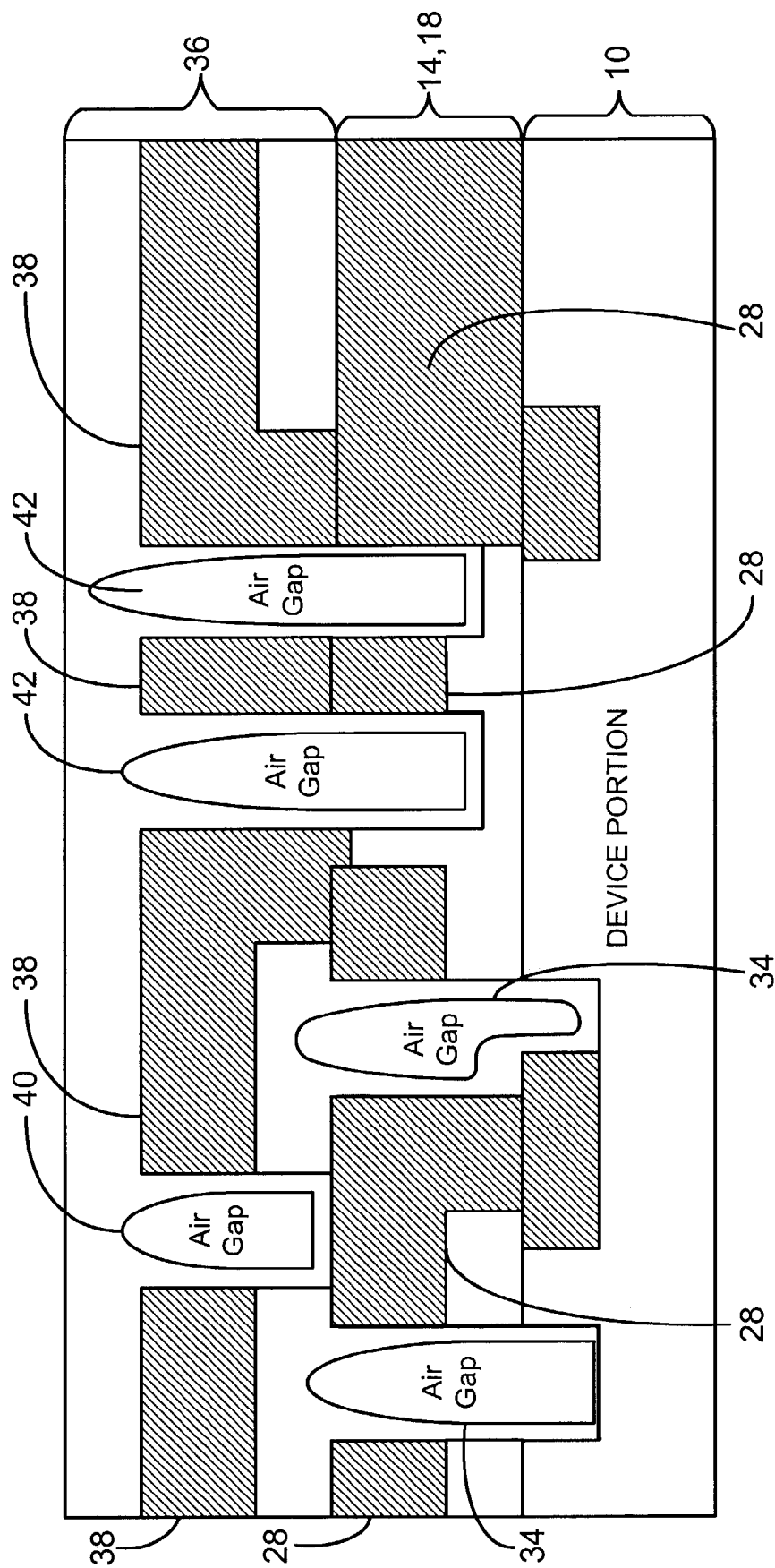
FIG. 13 is a cross-sectional view of a resulting air gap isolation structure according to the present invention, accommodating the use of multiple levels of a dual-damascene metal interconnect process.

In FIG. 13, a composite drawing is shown of two dual damascene structures fabricated in sequence according to the method of the present invention. A device layer 10 includes a silicon substrate and a portion of first level of metal interconnect 28 extends herein as well. In a first level of interconnect structure according to the present invention, copper metal layer 28 and air gaps 34 are shown extending in and to the top of dielectric layers 14 and 18. Note that air gaps 34 are shown to extend below the level of the upper surface of the device layer 10 as well as above the upper surface of metal lines 28, thus providing the maximum electrical isolation between adjacent metal structures.

Also shown in FIG. 13 is a second level of metal interconnect that includes an additional metal interconnect 38 and a dielectric layer 36 with air gaps 40 and 42. Air gap 40 provides intra-level metal isolation and extends to the surface of device layer including layers 10, 14, and 18, as well as above the upper surface of metal lines 38. Air gaps 42 extend below the surface of the device layer including layers 10, 14, and 18, and thus provide electrical intra-metal isolation for both metal layers 38 and 28.

Furthermore it will be apparent that this overall process could be repeated as needed to form additional interconnect layers, and the present invention is by no means limited to any particular number of such layers.

Another important observation about the present invention that can be gleaned from FIG. 13, is that in some instances an air gap for a second level interconnect may be formed on top of a first level interconnect. In other instances a single air gap can be extended in height so that it serves to reduce capacitance for more than one interconnect layer. For example, the air gap 42 shown in the middle of FIG. 13 serves as an air gap for two separate metal interconnect levels; this same principle could be extended as needed for additional levels. Thus by appropriate "stacking" and arrangement of interconnect layers, a single air gap can be formed between adjacently located conductive lines in more than one layer of metal.

As illustrated herein, the dielectric material 14 underneath the conductive lines further functions to provide some measure of structural support for the latter. This feature can be enhanced or reduced in other embodiments by structural variations so that more or less dielectric is left on the sidewalls, or under the top portions of the conductive lines. The dielectric also functions as a heat dissipator, and further reduces electromigration. Accordingly, the amount of dielectric left on the sidewalls can be tailored for any particular environment, so that it might be used extensively in some applications (thicker layers), and not used in others (thin layers, or no layers at all).

Second Embodiment

Referring generally now to FIGS. 14–24, a method for forming an integrated circuit device having at least one air gap structure is shown for a conventional metal interconnect structure of the type having aluminum alloy metal interconnect layers and tungsten metal plugs. Except where otherwise noted, like numerals are intended to represent like structures and materials already identified in connection with FIGS. 1–13.

Figure 14:
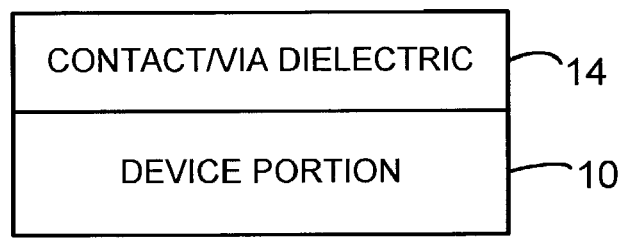
FIGS. 14–24 are cross-sectional views of sequential integrated circuit processing steps for forming an air gap isolation structure according to a second embodiment of the present invention using one of several acceptable conventional metal interconnect processes.

In FIG. 14, a device layer 10 is formed as before.

A contact/via dielectric layer 14 is formed on device layer 10. As before, dielectric layer 14 is ideally silicon dioxide but can also be USG, FSG, PSG, BPSG, or the like and is deposited to a thickness of about 1000 to 10000 Angstroms. It will be understood, of course, that layer 14 may be comprised of a combination of layers, and formed in more than one processing step, but for purposes of the present discussion, it will be referred to as a single layer.

Figure 15:
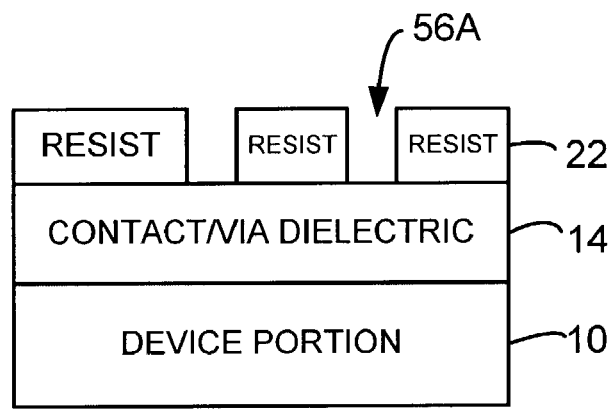

In FIG. 15, a photoresist layer 22 is formed on dielectric layer 14 to a thickness of about 1000 to 10000 Angstroms. Photoresist layer 22 is patterned to form metal contact or via pattern 56A by photolithography processes as before.

Figure 16:
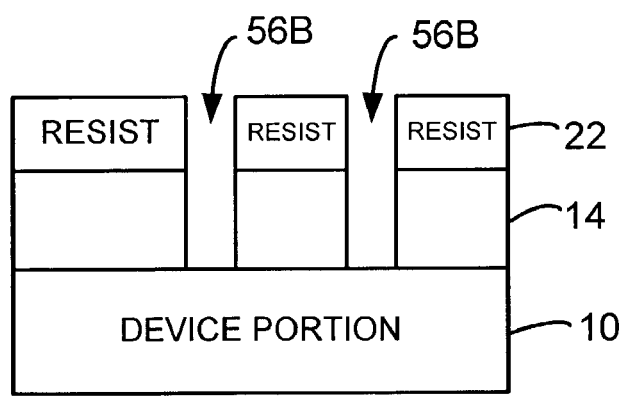

In FIG. 16, as noted before, openings 56B are etched into the contact/via dielectric layer 52 in a similar fashion to that already described for FIG. 4.

Figure 17:
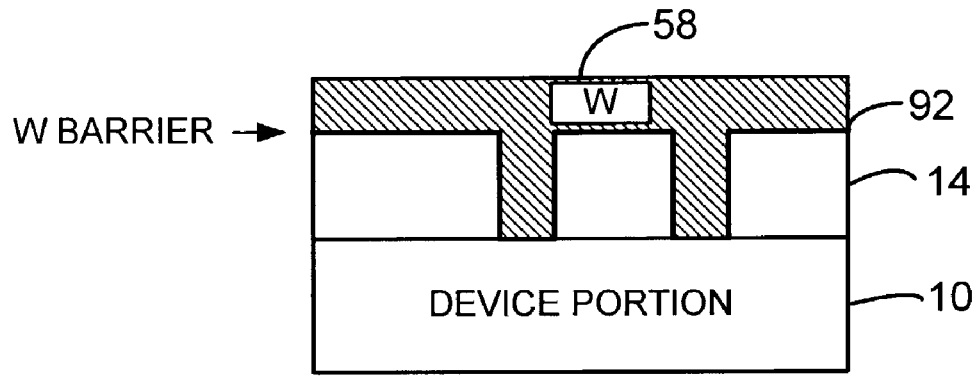

In FIG. 17, resist layer 22 is stripped and a tungsten barrier layer 92 (such as Ti/TiN, Ta, TaN etc.) is deposited on the surface of dielectric layer 52 and in openings 56. Again, these are merely examples of those known at this time to be particularly suited for Tungsten, and other compositions may be needed for other types of conductive line metals. For some metals, of course, a barrier layer may not be needed in the first place.

A layer of Tungsten 58 is then preferably deposited to a thickness of about 500 to 8000 Angstroms, which completely fills openings 56. Again, for other processes, materials other than Tungsten may be more suitable.

Figure 18:
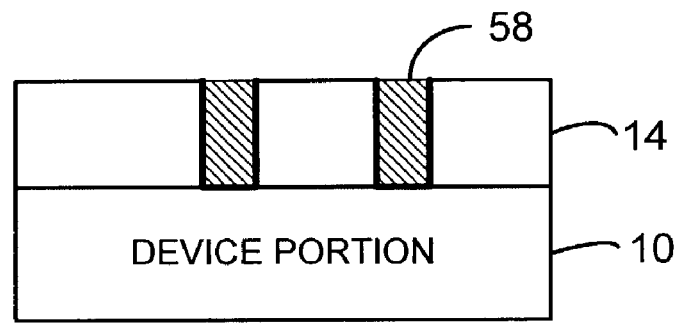

In FIG. 18, any excess tungsten is removed using tungsten CMP or tungsten etch back, which results in a structure that includes dielectric layer 14 and tungsten metal plugs 58. In self-limiting growth processes, this type of CMP operation may be minimized or reduced.

Figure 19:
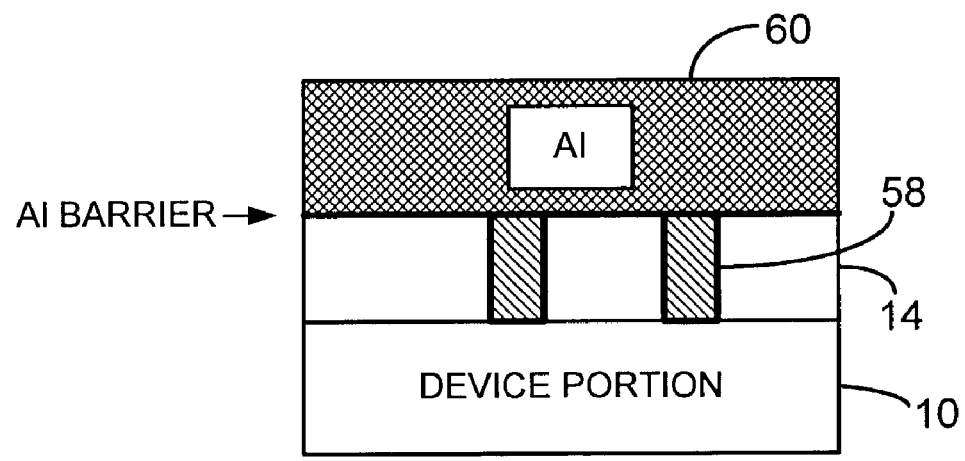

In FIG. 19, an aluminum alloy (or the like) interconnect layer 60 is deposited on combined metal plug/dielectric layer 14/58 to a thickness of about 2000 to 10000 Angstroms. Again, for other processes, materials other than an aluminum alloy may be more suitable. For example, doped polycrystalline silicon is also well-known as an effective conductive interconnect/gate material.

Figure 20:
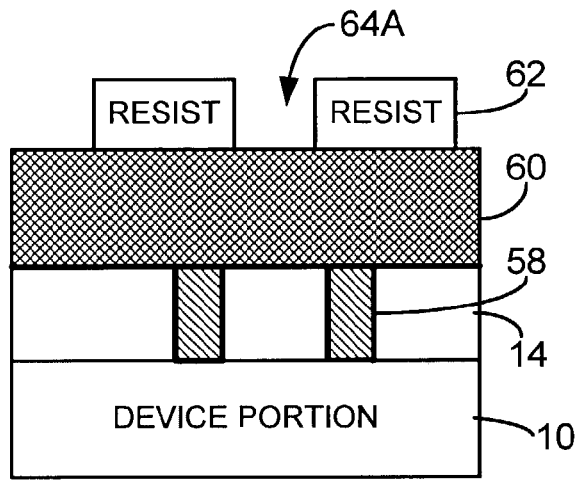

In FIG. 20, a resist layer 62 is formed on the metal layer 60 in any conventional manner to a thickness of preferably about 2000 to 15000 Angstroms and followed preferably by a photolithography process to result in metal line pattern 64A.

Figure 21:
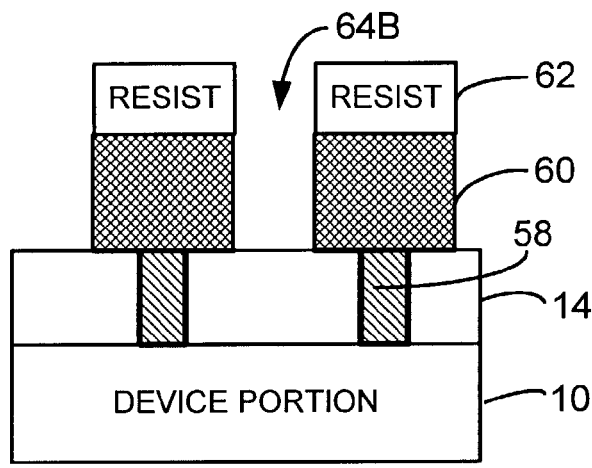

In FIG. 21, an intra-metal spacing 64B is formed by etching metal layer 60 using a conventional metal etching process to form an interconnect structure consisting of patterned metal layer 60 and spacings 64B. Again, the particular etch chemistry and technique will depend on the particular material selected for layer 60.

Figure 22:
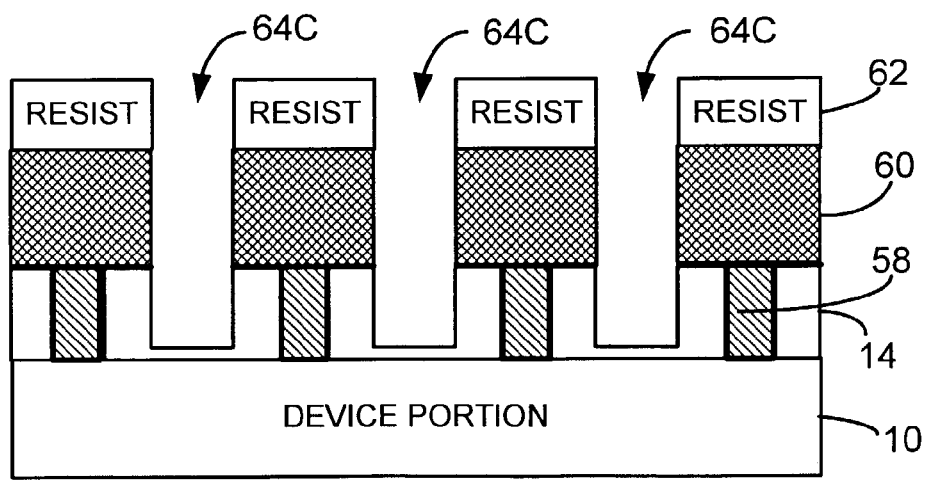
Figure 23:
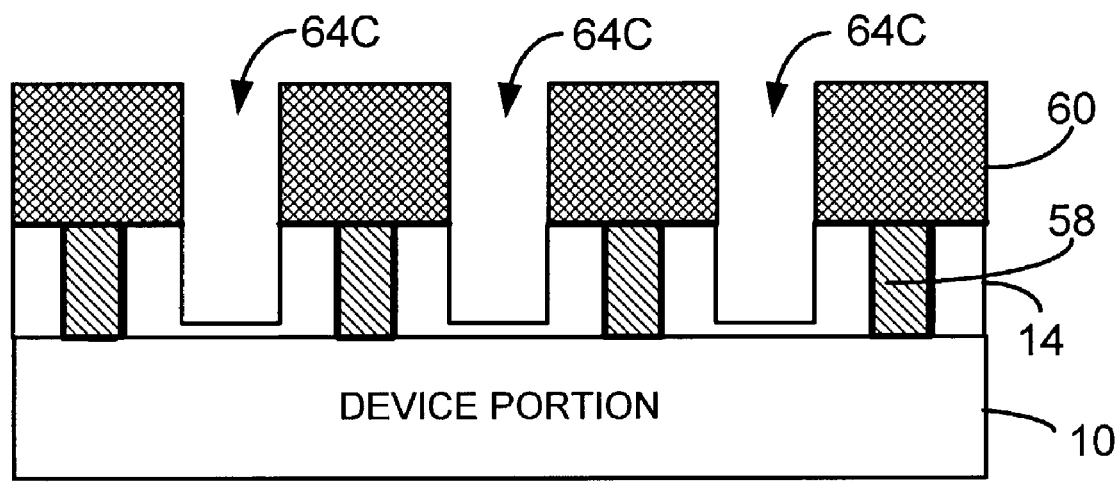

In FIG. 22, the metal interconnect structure of FIG. 21 is shown in conjunction with several other metal plugs 58, each capped by a section of metal interconnect layer 60. It will be understood, of course, that it is not necessary to locate every interconnect line above a metal plug.

In a preferred first processing option, any material in spacings 64B is removed and etched down to the surface of the device layer 50 with the resist layer 62 intact to form trenches 64C. As explained in connection with FIG. 11 as well, the depth of trenches 64C is adjustable and can be made down to and even below the upper surface of the device layer 10 (not shown in FIG. 22).

In a second processing variation of this embodiment (shown in FIG. 23), resist layer 62 is first stripped and previously etched metal layer 60 is used as a hard mask to etch trenches 64C. The choice between these two variations can be made on a case by case basis in accordance with conventional and well-known process requirements.

Figure 24:
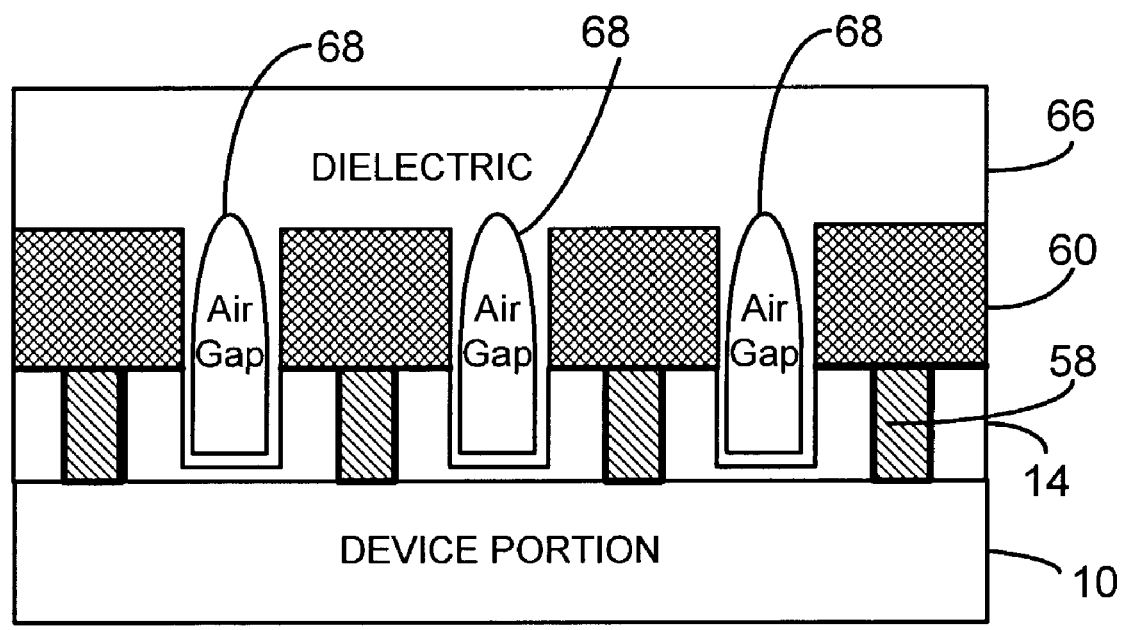

In FIG. 24 air gaps are formed in substantially the same manner as depicted earlier for FIG. 12. That is, a silicon-dioxide or the like dielectric layer 66 is deposited onto the surface to a thickness of about 2000 to 10000 Angstroms. Poor step coverage by the deposition of dielectric layer 66 results in the formation of intra-metal line air gaps 68. Air gaps 68 provide superior electric isolation due to the low dielectric constant of air as previously discussed.

It will be appreciated by those skilled in the art that this second embodiment can also be used to create structures that are similar to those already illustrated in FIGS. 12A and 12B, including air gaps of different height, width, etc. Moreover, the above steps can be sequenced again to form multi-level interconnect structures in the same manner as previously described for FIG. 13. Thus, air gaps can be used as an insulation layer between inter-metal or intra-metal layers formed of Al, Al alloys, polycrystalline silicon, etc.

Third Embodiment

Referring generally now to FIGS. 25–33, a third embodiment of a method for forming an integrated circuit device having at least an air gap structure is shown for a conventional metal interconnect structure of the type having aluminum alloy metal interconnect layers and aluminum alloy metal plugs. The primary difference to the second embodiment is in the use of a different type of a barrier metal layer for the interlayer plugs.

Figure 25:
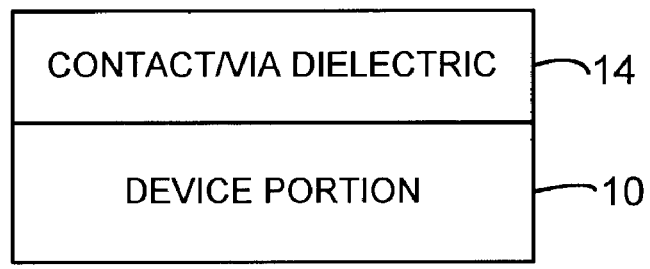
FIGS. 25–33 are cross-sectional views of sequential integrated circuit processing steps for forming an air gap isolation structure according to a third embodiment of the present invention using a conventional metal interconnect process.

In FIG. 25, a contact/via dielectric layer 14 is formed on device layer 10 as before.

Figure 26:
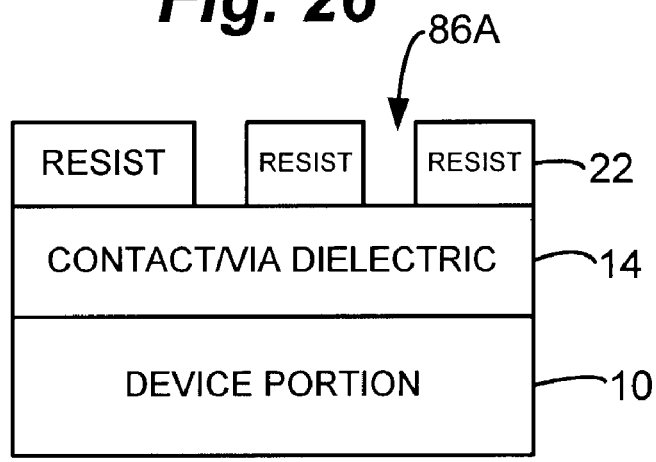

In FIG. 26, a photoresist layer 22 is formed and patterned on dielectric layer 14 as before to form a pattern of openings 86A.

Figure 27:
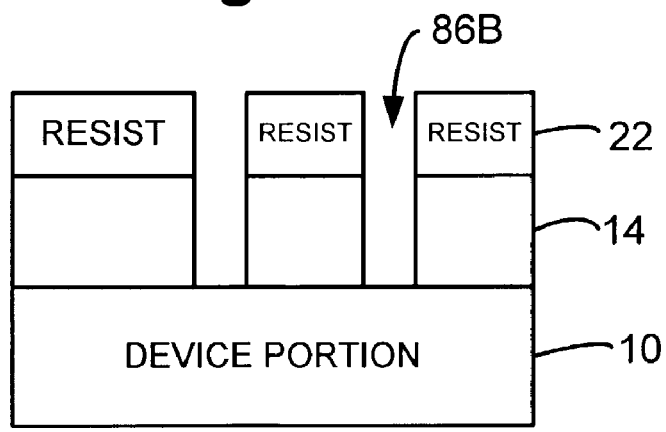

In FIG. 27, openings 86B are etched into contact/via dielectric layer 14 as before.

Figure 28:
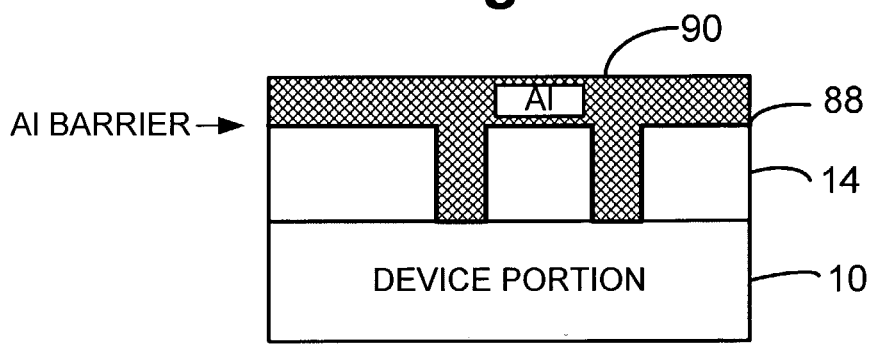

In FIG. 28, resist layer 22 is stripped and an aluminum barrier layer 94 (such as Ti/TiN, Ta, TaN or Aluminum oxide) is deposited on the surface of dielectric layer 82 and in openings 86. Again, these are merely examples of those known at this time to be particularly suited for Aluminum, and other compositions may be needed for other types of conductive line metals. For some metals, of course, a battier layer may not be needed in the first place.

An aluminum alloy layer 90 (preferably Aluminum with some small percentage of Cu and/or Si) is then deposited to a thickness of about 500 to 8000 Angstroms, which completely fills contact/via openings 86B and provides an aluminum alloy interconnect layer coupled to aluminum alloy plugs 88.

This embodiment, therefore, is distinguished from the second embodiment noted earlier in that the plug and interconnect layer can be formed in a single step, thus improving throughput for those applications where it is acceptable to use something other than a Tungsten based plug.

Figure 29:
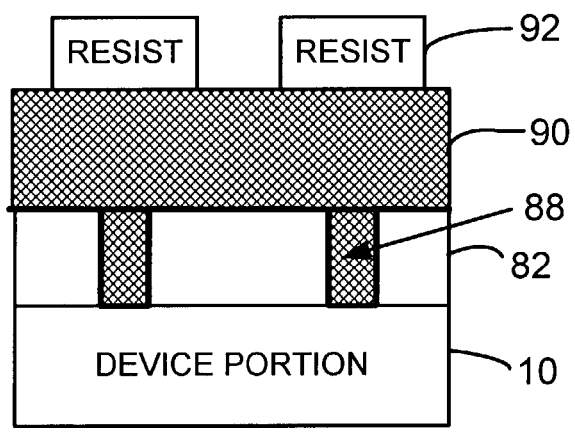

In FIG. 29, as before a resist layer 92 is formed on the metal layer to a thickness of about 2000 to 15000 Angstroms followed by a photolithography process.

Figure 30:
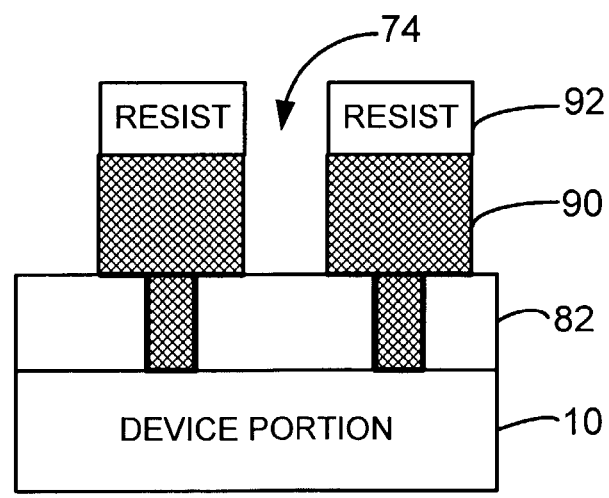

In FIG. 30, an intra-metal spacing 74B is formed by etching the aluminum metal layer 90 using a conventional metal etching process as noted earlier for FIG. 21.

Figure 31:
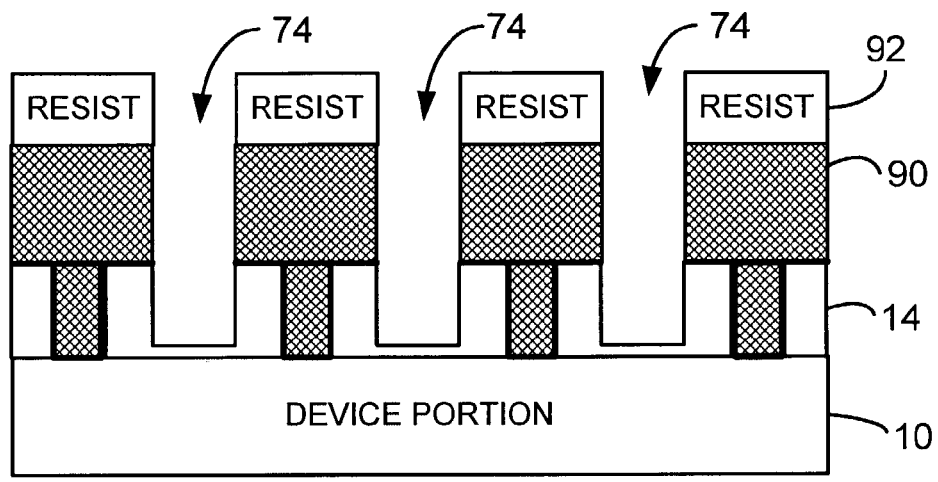

In FIG. 31, the metal interconnect structure of FIG. 30 is shown in conjunction with several other metal plugs 88, each capped by a section of aluminum alloy metal interconnect layer 90. As before, it will be understood, of course, that it is not necessary to locate every interconnect line above a metal plug.

In a preferred first processing option, any material in intra-metal spacings 74B is removed and etched down to the surface of the device layer 10 with the resist layer 92 intact to form trenches 74C. As explained in connection with FIG. 11 as well, the depth of trenches 74C is adjustable and can be made down to and even below the upper surface of the device layer 10 (not shown in FIG. 31).

Figure 32:
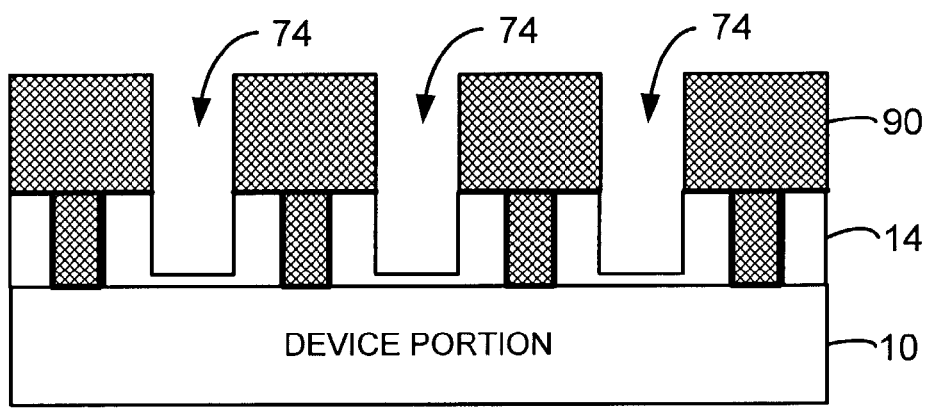

In a second processing variation shown in FIG. 32, resist layer 92 is first stripped and previously etched metal layer 90 is used as a hard mask to etch trenches 74. Again the choice between these two variations can be made on a case by case basis in accordance with conventional and well-known process requirements.

Figure 33:
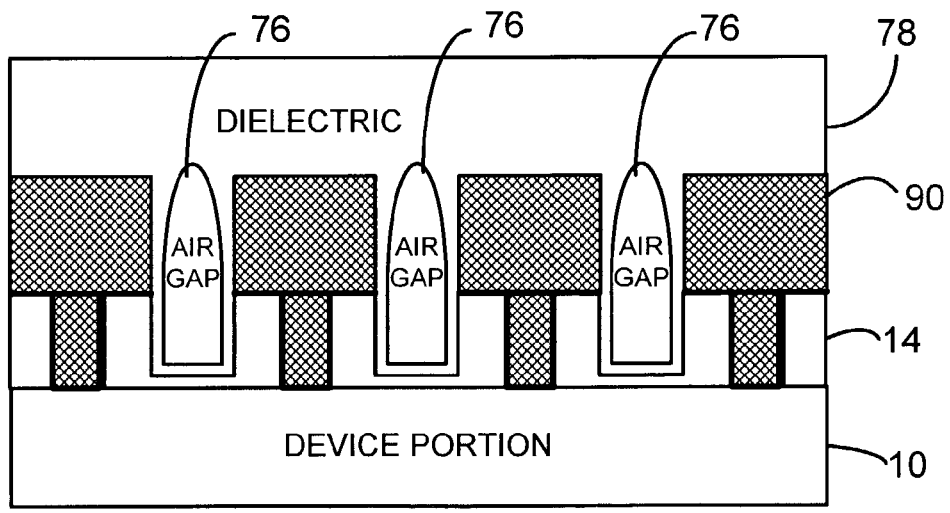

In FIG. 33 air gaps are formed in substantially the same manner as depicted earlier for FIG. 12. That is, a silicon-dioxide dielectric layer or the like 78 is deposited to fill the trenches 74 and cover the metal pattern 90 to a thickness of about 1000 to 8000 Angstroms. Poor step coverage by the deposition of dielectric layer 78 results in the formation of intra-metal line air gaps 76. Air gaps 76 provide superior electric isolation due to the low dielectric constant of air as previously discussed.

It will be appreciated by those skilled in the art that this third embodiment can also be used to create structures that are similar to those already illustrated in FIGS. 12A and 12B, including air gaps of different height, width, etc.

Figure 34:
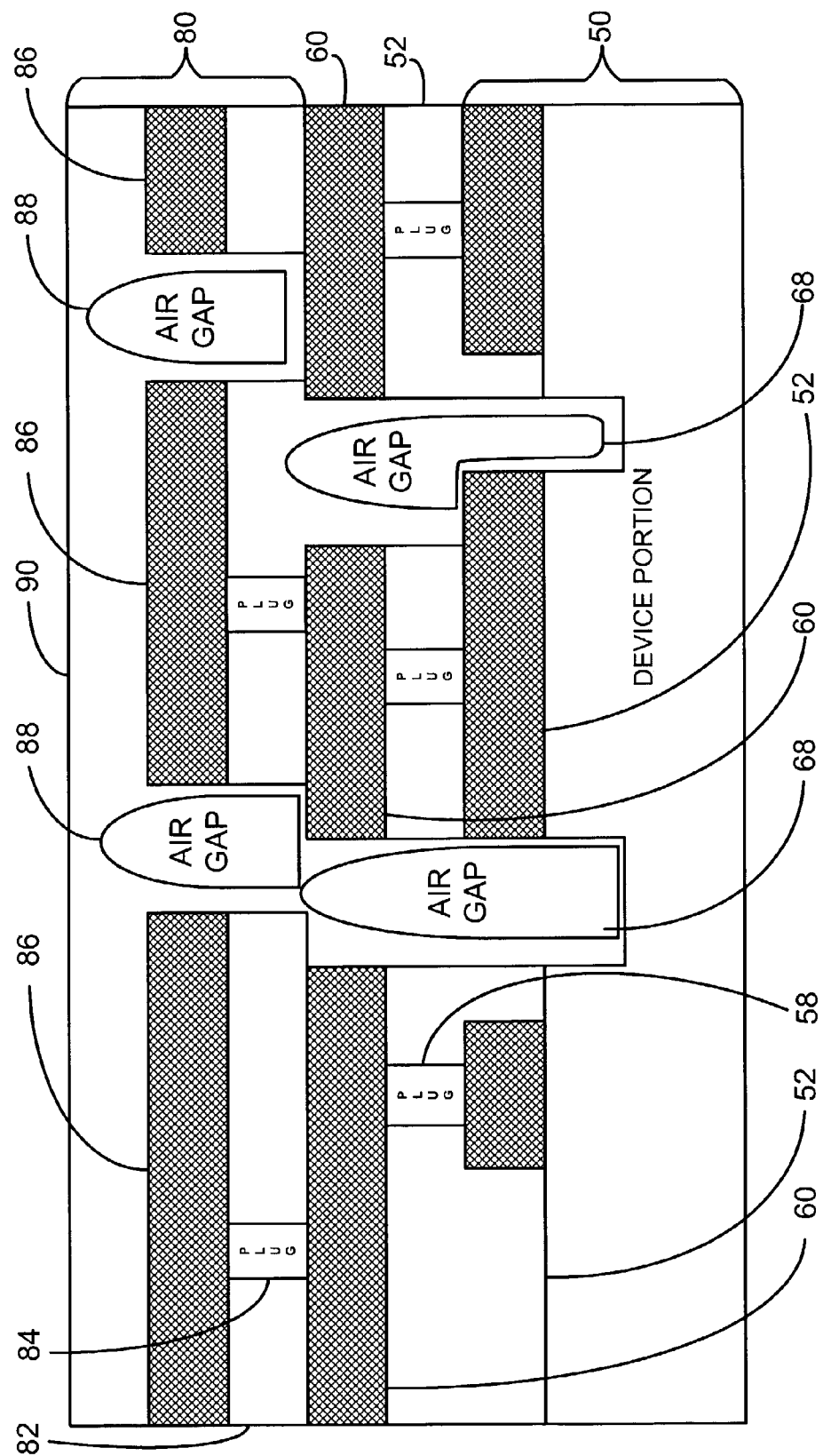
FIG. 34 is a cross-sectional view of an air gap isolation structure according to the second/third embodiments of the present invention, accommodating the use of multiple levels of a conventional metal interconnect process.

Moreover, the above steps can be sequenced again to form multi-level interconnect structures in the same manner as previously described for FIG. 13, and as shown generally in FIG. 34.

In FIG. 34, a composite drawing is shown of two metal interconnect structures fabricated according to the third (and second) air gap method of the present invention. In a first level of interconnect structure according to the present invention, metal interconnect 60, metal plugs 58, and air gaps 68 are shown embedded in dielectric layer 14 above device layer 10.

Note that as with FIG. 13, the resulting structure of FIG. 34 shows that that air gaps 68 can extend below the level of the upper surface of device layer 50 and above the upper surface of metal lines 60, thus providing maximum electrical isolation. Also shown in FIG. 34 is a second level of metal interconnect layer 80 that includes an additional metal level 86, metal plugs 84, and air gaps 88. Air gap 88 provides intra-level metal isolation and extends to layers 50, 52, and 60.

Fourth Embodiment

A fourth embodiment is now described with reference to FIGS. 35–38. This embodiment is a variant of the first embodiment in which an etch stop layer between a line dielectric and a via dielectric is eliminated to further reduce the effective dielectric constant of the inter-metal dielectric layer.

Figure 35:
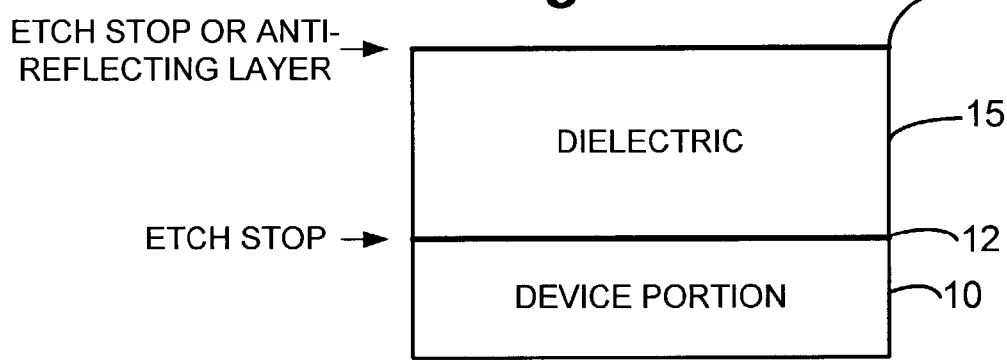
FIGS. 35–38 are cross-sectional views of sequential integrated circuit processing steps for forming an air gap isolation structure according to a fourth embodiment of the present invention, which is a variant of the first embodiment in which an etch stop layer between a line dielectric and a via dielectric is eliminated to further reduce the effective dielectric constant of the inter-metal dielectric layer.

Thus, in FIG. 35, the second etch stop layer 16 between the via and line dielectric layers 14 and 18 (FIG. 2) has been eliminated to further reduce the effective dielectric constant of the inter-metal dielectric layer. In lieu of two dielectric layers separated by an etch stop layer, a single dielectric layer 15 is deposited onto the surface of etch stop layer 12. The single dielectric layer 15 is also ideally silicon dioxide or the like and is deposited to a thickness of about 1000 to 10000 Angstroms in a manner similar to that already described for via dielectric layer 14.

An etch stop and/or anti-reflecting layer 20 is subsequently deposited on the line dielectric layer 15 as discussed before in connection with FIG. 2.

Figure 36:
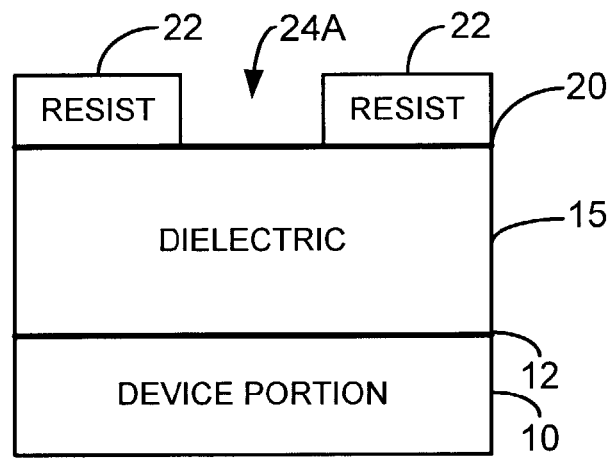

In FIG. 36, a photoresist layer 22 is formed on etch stop and/or anti-reflecting layer 20 to a thickness of about 1000 to 10000 Angstroms as already described in FIG. 3.

Figure 37:
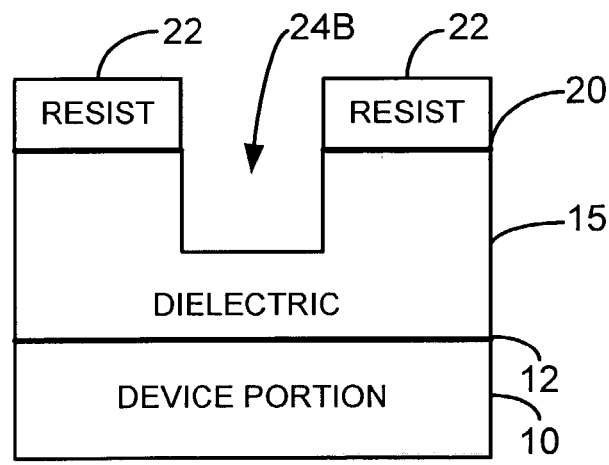

In FIG. 37, using metal contact or via pattern 24A as a mask, the dielectric layer 15 is anisotropically etched to form metal contact or via opening 24B as already described in FIG. 4. The primary difference from FIG. 4 is that, as generally illustrated, dielectric layer 15 is only partially etched, in this case, to a depth of approximately slightly more than half the thickness of such layer.

Figure 38:
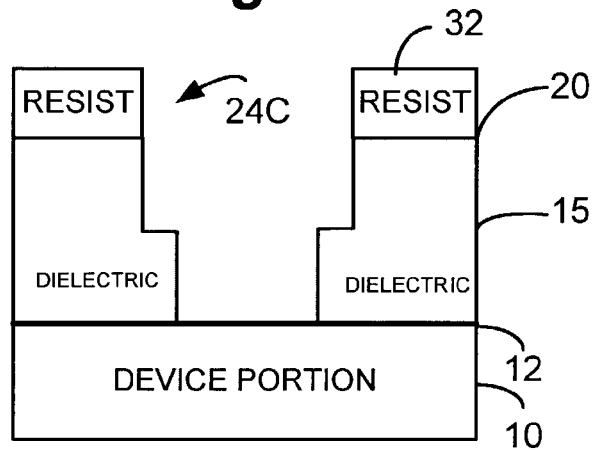

In FIG. 38, after removing the resist layer 22, another photoresist layer 32 is processed to form metal line pattern 24C by photolithography processes as generally already described in FIG. 5.

From this point forward, processing takes place in substantially the same fashion as already illustrated above in connection with FIGS. 6–13, thus resulting in a single or multi-level air gap interconnect structure, albeit with slightly modified layer compositions as noted here.

Fifth Embodiment

A fifth embodiment is now described with reference to FIGS. 39–40. This embodiment is also a variant of the first embodiment in which a first etching operation is performed only as far as a first etch stop layer.

Figure 39:
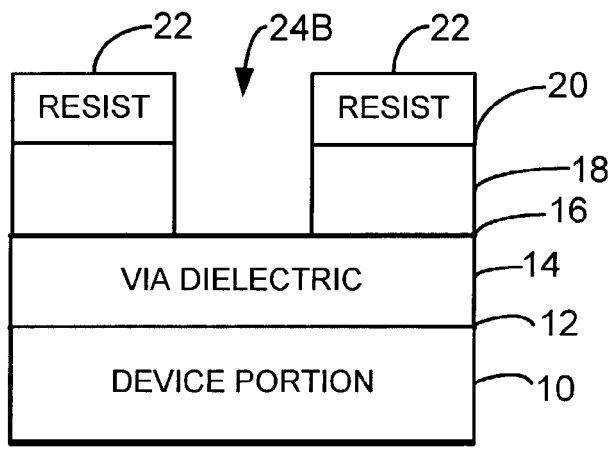
FIGS. 39–40 are cross-sectional views of sequential integrated circuit processing steps for forming an air gap isolation structure according to a fifth embodiment of the present invention, which is a variant of the first embodiment in which a first etch is performed only as far as a first etch stop layer.

Accordingly, FIG. 39 illustrates a variation in which given the structure shown in FIG. 3, an etching operation is conducted in a similar fashion to that already describe in FIG. 4, except that such etch is stopped upon reaching second etch stop layer 16. In all other respects, this operation is the same, in that line dielectric layer 18 is anisotropically etched using via pattern 24A as a mask to form a metal contact or via opening 24B. It is only the case, therefore, that these openings do not extend as far down as those illustrated in FIG. 4.

Figure 40:
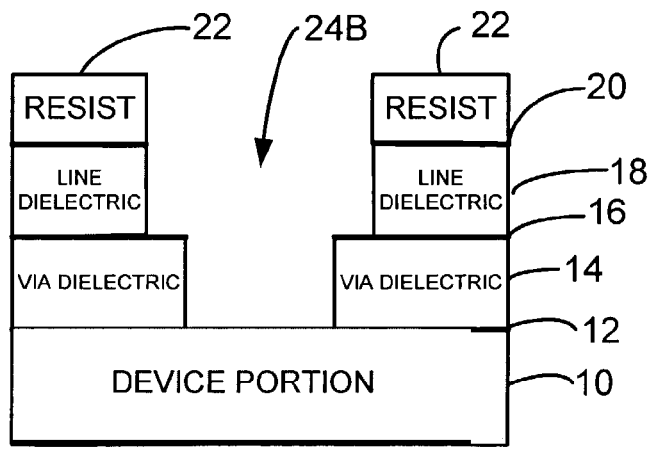

In FIG. 40, after removing the resist layer 22, another photoresist layer 32 is formed. A subsequent etch transfers the upper profile of opening 24C to the bottom of the openings, so that a deeper enlarged opening 24D results that is substantially the same as shown in FIG. 6.

From this point forward, processing takes place in substantially the same fashion as already illustrated above in connection with FIGS. 7–13, thus resulting in a single or multi-level air gap interconnect structure, albeit with slightly modified layer compositions as noted here.

While there have been described above the principles of the present invention in conjunction with specific circuit implementations and applications it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A method for forming an air gap structure in an integrated circuit, the steps comprising:
   forming a conductive structure with a first dielectric layer on a substrate, said conductive structure including conductive plugs;
   forming at least an opening on the first dielectric layer and adjacent to the conductive structure; and
   forming a second dielectric layer over the substrate and substantially surrounding at least one of said conductive plugs, using a conformal growth, plasma based process to form at least an air gap in the opening.

2. The method of claim 1, wherein said conductive structure comprises a metal line layer and a metal via layer including said conductive plugs.

3. The method of claim 1, wherein at least one said air gap has a height above the top of the conductive structure.

4. The method of claim 1, wherein at least one said air gap has a depth below the bottom of the conductive structure.

5. The method of claim 1, wherein the conductive structure is used as a mask to form said at least an opening.

6. A method for forming an integrated circuit, the method comprising:
   forming a device layer on a substrate; and
   forming at least a first dielectric layer on the device layer; and
   patterning said at least first dielectric layer to form first openings for plugs; and
   forming an interconnect structure including a patterned conductive layer overlaying conductive plugs formed in said first openings;
   forming an adjustable-depth trench between the patterned interconnect structure; and
   forming a second dielectric layer in a single step over the trench and substantially surrounding at least one of said conductive plugs, using a conformal growth, plasma based process to form at least one air gap therein.

7. The method of claim 6, further including steps of: making an electrical connection to said device layer using said conductive plugs.

8. The method of claim 6, wherein said conductive plugs consist of a metal material including Tungsten and/or aluminum based metal.

9. The method of claim 6, wherein said patterned conductive layer includes an aluminum based metal.

10. The method of claim 6, wherein said interconnect structure includes refractory material barrier layer.

11. The method of claim 6, wherein said interconnect structure is used as a mask during formation of said at least one air gap.

12. The method of claim 6, further including a step of forming a barrier layer in said first opening and said second opening prior to forming said first plug and said second plug respectively.

13. The method of claim 6, wherein said second dielectric layer has relatively poor step coverage.

14. The method of claim 6, wherein said air gap extends below a top surface of said device layer.

15. The method of claim 6, wherein said air gap extends above a top surface of said conductive layer.

16. A method for forming an air gap structure in an integrated circuit, the method comprising:
   forming a device layer; and
   forming at least a first dielectric layer on the device layer; and
   patterning said at least first dielectric layer to form first openings for plugs; and forming a conductive structure including a conductive line layer over a conductive plug layer;

wherein at least some of said conductive plugs in said conductive plug layer extend and form an electrical connection to said device layer; and forming a second opening between two adjacent ones of said first conductive lines in said interconnect structure; and wherein said second opening is characterized by a trench depth that can be varied by controlling an etch process;

forming a second dielectric layer over said second opening and substantially surrounding at least one of said conductive plugs, using a conformal growth, plasma based process to form at least one air gap between said two adjacent ones of said first conductive lines;

wherein said at least one air gap has a height that is controlled in part by said trench depth.

17. The method of claim 16, wherein said trench depth can extend below respective bottom portions of said two adjacent conductive lines so as to effectuate a desired air gap size.

18. The method of claim 16, wherein said air gap height is further controlled by controlling parameters of a deposition operation used for forming said second dielectric layer, including a step coverage parameter.

19. The method of claim 18, wherein said air gap extends over a top surface of said conductive layer.

20. The method of claim 16, wherein said trench depth is controlled by controlling a time of an etch process.

21. The method of claim 16 wherein the depth of said air gap extends below a top surface of said device layer.

22. The method of claim 16, wherein said second dielectric layer includes a CVD layer, and an HDPCVD layer.

23. The method of 16, wherein said conductive plug layer includes a tungsten metal and/or an aluminum based metal.

24. A method for forming an air gap structure in an integrated circuit, the method comprising:

forming a device layer; and forming at least a first dielectric layer on the device layer; and patterning said at least first dielectric layer to form first openings suitable for conductive plugs; and forming a first conductive structure including a first conductive line layer over a first conductive plug layer;

wherein at least some of said first conductive plugs in said first conductive plug layer extend and form an electrical connection to said device layer; and forming at least a second dielectric layer on the first interconnect structure of first conductive lines;

planarizing the said second dielectric layer;

forming second openings in said planarized second dielectric layer suitable for conductive plugs; and forming a second conductive structure including a second conductive line layer over a second conductive plug layer;

wherein at least some of said second conductive plugs in said second conductive plug layer extend and form an electrical connection to said first interconnect structure; and forming at least one third opening which extends from said second interconnect structure to said first interconnect structure; and forming a third dielectric layer over said third opening and substantially surrounding at least one of said conductive plugs using a conformal growth, plasma based process to form at least one multi-level air gap that is situated between adjacently located conductive lines in said second interconnect structure of second conductive lines;

wherein said at least one multi-level air gap operates to isolate adjacently located interconnect lines in at least two separate interconnect levels located at different distances from said device layer, including in said first interconnect structure and said second interconnect structure.

25. The method of claim 24, further including steps of forming a first single level air gap in said first interconnect structure, and forming a second single level air gap in said second interconnect structure.

26. The method of claim 24, further including a step of forming an air gap directly on top of at least one of said first conductive lines.

27. The method of claim 24, wherein said multi-level air gap is formed using said first conductive lines and said second conductive lines as a mask, and without using a photoresist mask.

28. The method of claim 24, wherein said at least one multi-level air gap extends below a top surface of said device layer.

29. A method for forming an air gap structure in an integrated circuit, the method comprising:

forming a device layer; and forming at least a first dielectric layer on said device layer; and patterning said at least first dielectric layer to form first openings for plugs; and forming a conductive structure including a conductive line layer over a conductive plug layer;

wherein at least some of said conductive plugs in said conductive plug layer extend and form an electrical connection to said device layer; and forming a second opening between two adjacent ones of said first conductive lines in said interconnect structure; and wherein said second opening is characterized by a trench depth that can be varied by controlling an etch process;

forming a second dielectric layer over said second opening and substantially surrounding at least one of said conductive plugs, using a conformal growth, plasma based process to form at least one air gap between said two adjacent ones of said first conductive lines;

wherein said plurality of air gaps are characterized by a variable height and size such that at least some of said air gaps have a top portion that extends above said top portion of said conductive lines, and at least some of said air gaps have a bottom portion that extends below said bottom portion of said conductive lines.

30. The method of claim 29 wherein said conductive line layer include Aluminum alloy.

31. The method of claim 29 wherein said conductive plugs include a tungsten metal and/or an aluminum based metal.

32. The method of claim 29 wherein said interconnect structure includes refractory material barrier layer.

33. The method of claim 29, wherein said second dielectric layer is deposited using a conformal growth based process to a thickness that ranges from 1000 to 10000 Angstroms.

34. The method of claim 29, wherein spaces between said conductive lines are occupied by a combination of air gaps and dielectric material so as to result in an overall dielectric constant less than about 2.

* * * * *